US009006612B2

(12) United States Patent
Sanchez et al.

(10) Patent No.: US 9,006,612 B2
(45) Date of Patent: Apr. 14, 2015

(54) METHOD AND DEVICE FOR CREATING A TEMPERATURE GRADIENT AMONG A PLURALITY OF TEMPERATURE GRADIENT STRUCTURES

(75) Inventors: Jason D. Sanchez, Delmar, NY (US); Piotr A. Garbuz, New York, NY (US)

(73) Assignee: Game Changers, LLC, New York, NY (US)

( * ) Notice: Subject to any disclaimer, the term of this patent is extended or adjusted under 35 U.S.C. 154(b) by 634 days.

(21) Appl. No.: 13/039,238

(22) Filed: Mar. 2, 2011

(65) Prior Publication Data

US 2011/0240622 A1 Oct. 6, 2011

Related U.S. Application Data

(63) Continuation of application No. PCT/US2010/002428, filed on Sep. 3, 2010.

(60) Provisional application No. 61/239,446, filed on Sep. 3, 2009, provisional application No. 61/264,778, filed on Nov. 27, 2009, provisional application No. 61/296,198, filed on Jan. 19, 2010.

(51) Int. Cl.
*H05B 1/00* (2006.01)
*H05B 3/00* (2006.01)
*H05B 11/00* (2006.01)
*F03H 99/00* (2009.01)
*H01L 35/00* (2006.01)

(52) U.S. Cl.
CPC ............... *F03H 99/00* (2013.01); *H01L 35/00* (2013.01); *Y10S 977/833* (2013.01)

(58) Field of Classification Search
USPC ................ 219/201, 200, 209, 385, 538–544; 342/351; 62/1–3.5, 3.61, 3.7; 977/833; 136/205
See application file for complete search history.

(56) References Cited

U.S. PATENT DOCUMENTS

2004/0219070 A1* 11/2004 Handique ................... 422/99
2006/0001569 A1*  1/2006 Scandurra .................. 342/351
2009/0151434 A1*  6/2009 Kim et al. .................... 73/105

* cited by examiner

*Primary Examiner* — Tu B Hoang
*Assistant Examiner* — Michael Hoang
(74) *Attorney, Agent, or Firm* — Buchanan Ingersoll & Rooney PC

(57) ABSTRACT

A method and device for creating a temperature gradient among a plurality of temperature gradient devices. Each device is formed of a first layer of conductive material having a top surface and a bottom surface. The first layer is adjacent to a second layer of conductive material and has electrical resistive heating properties. A power supply is used to provide a current flow through at least the first layer when the power supply is activated. When activated, the resulting current flow causes the second layer to heat and thus create a temperature gradient between the bottom surface of the second layer and the top surface of the first layer. Activation of the power supply is controlled by a control unit so that activation of adjacent temperature gradient devices is avoided for a predetermined time after activation of the first temperature gradient device.

19 Claims, 48 Drawing Sheets

METHOD AND DEVICE FOR CREATING A TEMPERATURE GRADIENT AMONG A PLURALITY OF TEMPERATURE GRADIENT STRUCTURES

CROSS REFERENCE

This application is related to U.S. Provisional Application Nos. 61/239,446, filed Sep. 3, 2009, 61/264,778, filed Nov. 27, 2009, and 61/296,198, filed Jan. 19, 2010, and PCT International Application No. US2010/002428, filed Sep. 3, 2010, the entire contents of which are hereby incorporated by reference herein.

TECHNICAL FIELD

The present invention is generally related to the field of heating devices, and more particularly is directed to a method and apparatus for creating a temperature gradient among a plurality of temperature gradients, particularly in structures in the micrometer and/or nanometer scale.

BACKGROUND

Establishing a temperature gradient through a centimeter thick membrane is generally done by heating one side and/or cooling the other. An insulator can be placed between the two sides to increase efficiency. One way of establishing a temperature gradient of 1000° C. through a 1 cm thick membrane is to make the membrane out of a layer of steel and aerogel. When the surface of the steel is heated up to 1000° C., the surface of the aerogel will stay around room temperature for some time.

However the thickness of the membrane decreases, it becomes harder to form and maintain such gradients. In fact if one were to consider the ratio of 1000° C. per centimeter, this equates to 0.001 degrees per 100 nanometers. Such a temperature gradient has very few uses. However, establishing a 0.5° C. gradient over 100 nanometers would be equivalent to having a membrane of 1 cm thickness with room temperature on one side and the surface of the sun on the other.

There are several exotic ways of maintaining a temperature gradient at such small scales, mostly involving the implementation a cavity with vacuum as an insulator and using the Peltier effect or thermionic emission to establish the temperature bias. However such devices are relatively large, most of them appearing to be thicker than 10 microns.

To establish and maintain a temperature bias among a plurality of points in a membrane where such temperature bias is necessary, where the desired temperature bias over a distance of 10 microns or less in particular, new methods and devices appear to be necessary.

SUMMARY

The present invention can in certain embodiments fulfill this need for establishing a temperature gradient over a distance of 10 microns or less, but fulfilling this need is not necessarily an aspect of the present invention.

As disclosed herein, a system (method and device) of controlling creation of a temperature gradient among a plurality of temperature gradients includes creating a plurality of temperature gradients in a plurality of interrelated temperature gradient structures. Each of the temperature gradient structures has a first layer of conductive material having a first surface, an opposing second surface and having electrical resistive properties. It also has a second layer of material having a first surface and an opposing second surface, wherein the first surface of the second layer being adjacent the second surface of the first layer. Further, a power supply has its first electrical terminal coupled to the first surface of the first layer. Furthermore, a switch device has at least one input terminal and at least one output terminal, the input terminal being coupled to the second electrical terminal of the power supply and the output terminal of the switch device being coupled to the temperature gradient structure at a location that permits resistive heating of the first layer, wherein when the switch is closed an electrical current flows through the first layer to create a temperature gradient between the second surface of the first layer and the first surface of the second layer. Additionally, the system involves controlling the operation of the plurality of switch devices by a control unit, wherein the control unit controls the switch devices to create a selected temperature gradient. In certain embodiments the operation of the switch devices mitigates against creation of temperature gradients adjacent the selected temperature gradient structure for a predetermined time.

BRIEF DESCRIPTION OF THE DRAWINGS

The present methods, devices and systems will now be described by way of exemplary embodiments to which the invention defined by the claims appended hereto are not limited.

FIG. 40b is a cross sectional view of the embodiment shown in FIG. 40a.

FIG. 40c is another cross sectional view of the embodiment shown in FIG. 40a.

FIG. 41b is a cross sectional view of the embodiment shown in FIG. 41a.

DETAILED DESCRIPTION

Overview

Figure 1:
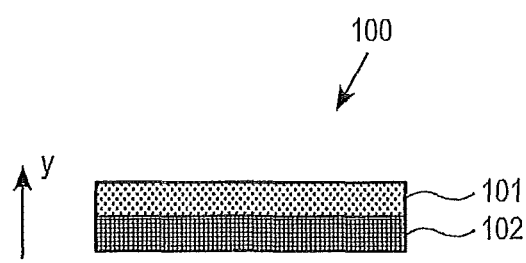
FIG. 1 shows a Peltier slab.

In preferred embodiments, the apparatus described here may be referred to as a Nanomolecular Solid State Electrodynamic Thruster (NMSet). The basis of operation of NMSet makes it possible to apply an NMSet in the fields of propulsion, adhesion, and refrigeration, depending on the manner in which an NMSet is employed. In preferred embodiments, NMSets and related devices provide lightweight, compact, energy-efficient creation of a gas pressure differential with adjustable flow velocity.

Propulsion

In some embodiments, NMSet can offer one or more of the following improvements in the field of propulsion:

1. Improved Resiliency: Damage to any area in a conventional propulsion system would probably lead to system-wide failure. An NMSet provides enhanced redundancy and robustness.
2. Lightweight: An NMSet does not need a particular fuel, so fuel load vanishes.
3. Scalability: Conventional propulsion systems cannot be easily scaled: optimal turbojets for small aircrafts are not scale reductions of optimal turbojets for large aircrafts.
4. Response Time: Thrust from an NMSet can be easily adjusted in response to changes of need.
5. Power Independence: Conventional propulsion systems require a specific type or class of fuels in order to operate, whereas an NMSet only requires a source of temperature differential, which can generated by electricity.
6. Green Propulsion: Because an NMSet does not have to rely on fossil fuels to operate, it does not produce polluting exhaust (e.g. carbon monoxide, nitrogen oxide) during ordinary operation.

Adhesion

In some embodiments, an NMSet device may be used as a lightweight mechanical adhesive. The process can be reversible as the only step required to reverse the adhesion is to cut power to the NMSet. Using an NMSet can provide further benefit over electrostatic adhesion in that an NMSet does not require a material to be adhered to be flat or conductive. Compared to other mechanical adhesion processes, using an NMSet may not require a surface being adhered to be pretreated.

Gas Compression

Because an NMSet device can be arranged to drive gas flow through a surface, all or part of a pressurized vessel may function to provide gas compression. Thus, in some arrangements, separated pumping and pressurized containment may not be required. Moreover, because, an NMSet's action generally occurs over a short distance, it is possible, in some embodiments, to use an NMSet as a highly compact compressor by stacking multiple stages of NMSets. Conventional propulsion systems generally operate over length scales of centimeters and sometimes meters. Thus, stacking conventional propulsion systems tends to be a complex and expensive proposition. By contrast, an NMSet can operate over micrometers. Furthermore, the versatility of an NMSet means that an NMSet can be readily adapted to function as a high-pressure pump, a standard atmospheric pump, or with a sufficient number of stages, as a high vacuum pump.

NMSet Design

In one aspect, an NMSet and the related devices described here may be thought of as functioning by reducing entropy in gas in contact with the NMSet. Optionally, a device may add energy, e.g. thermal energy, to the gas. In another aspect, the geometry of the NMSet can affect gas flow direction and convenience of use. NMSet and related devices may be distinguished from previous thermal transpiration devices and the like by the combined application of scale parameters, materials having advantageous molecular reflection properties, geometries, and/or arrangement of elements that provide significant increased in efficiency. Described herein are various exemplary embodiments of NMSets with discussion of these and other parameters that, in preferred embodiments, can create a strong gas flow in a particular direction with minimal thermodynamic loss.

Reduction of entropy in a gas by an NMSet may be represented by a transformation A in the momentum space k of the gas. A can be expressed in a matrix once a set of suitable bases is chosen for the momentum space k. If the expectation value of the transformed momentum space Ak is nonzero, the NMSet experiences a net momentum in the opposite direction of the expectation value due to the conservation of momentum.

The geometry of an NMSet may be optimized for efficient functioning. The geometry of the NMSet will affect the transformation matrix A. A geometry that produces a matrix A essentially equal to an identity matrix I does not create a net momentum bias (i.e. will not make the transformed momentum space Ak have a nonzero expectation value). Rather, gas vortexes may be generated. Geometries that result in larger eigenvalues of A tend to imply a more efficient function, e.g. that more momentum is carried by gas particles moving in a particular direction.

As an example, consider a Peltier slab 100 immersed in a gas, shown in FIG. 1. The Peltier slab 100 comprises an upper layer 101 and a lower layer 102. For simplicity, a Cartesian coordinate system can be referenced with a y-axis pointing from the lower layer 102 to the upper layer 101. A temperature differential can be established by a Peltier device (not shown) between the layers or any suitable means such that the upper layer 101 is colder than the gas and the lower layer 102 is hotter than the gas. While not wanting to be limited to any particular theory, the Peltier effect does not appear to transfer net heat into the gas, transformation caused by the Peltier slab 100 to the momentum space k of the gas can be expressed by a Hermetian matrix A. When a gas particle (molecule or atom) collides with the lower layer 102, assuming the collision is diabatic, the gas particle bounces off at a higher velocity than before the collision. When a gas particle collides with the upper layer 101, assuming the collision is diabatic, the gas particle bounces off the upper layer 101 at a lower velocity than before the collision. The Peltier slab 100 feels a net force pointing the lower layer 102 from to the upper layer 101, i.e. a net force in the y direction. In another word, the lower layer 102 heats and thus increases pressure of the gas below the lower layer 102, while the upper layer 101 cools and thus decreases the pressure of the gas above the upper layer 101. The pressure difference drives the Peltier slab 100 upward. In terms of transformation of the momentum space k of the gas, as gas particles bouncing from the upper layer 101 leave with less momentum than gas particles bouncing from the lower layer 102, the transformed momentum space Ak becomes skewed preferentially in the −y direction, i.e. the expectation value p of the transformed momentum space Ak is nonzero and points to the −y direction. Assuming the gas and the Peltier slab 100 compose a closed system (i.e. no interaction with other objects), the Peltier slab 100 gains a momentum −p to conserve the total momentum of the closed system.

Figure 2:
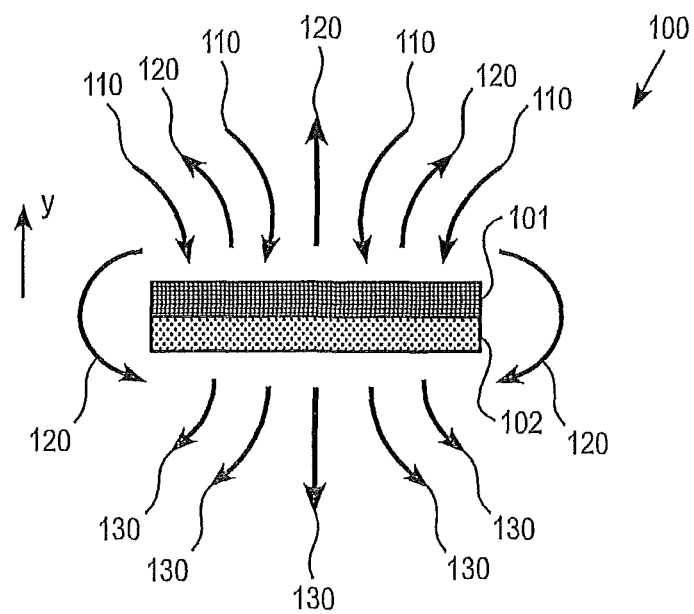
FIG. 2 shows gas flow patterns around the Peltier slab of FIG. 1.

While the geometry of the Peltier slab 100 in FIG. 1 does generate lift, the reason it cannot concurrently be used practically for the following reasons:
1. If the Peltier slab 100 is large, translational motion of the Peltier slab 100 along the y direction forces the gas to flow all the way around edges of the Peltier slab.
2. The vast majority of the heat is transferred from surfaces of the Peltier slab 100 via gas convection.
3. Gas near the surfaces has an insulating effect. Momentum transfer between the Peltier slab 100 and the gas is not efficient except in proximity of the edges of the slab, as shown in FIG. 2.
4. Surface area of the Peltier slab 100 is surface area of its convex hull.

These problems all relate to a single core issue, very little of the gas has any direct surface contact. Thus, a more complex geometry can be advantageous. Exemplary embodiments with three different geometries are described hereinbelow.

Principles of Operation

Although many different geometries of NMSet or related devices are possible, the principle of operation of NMSets remains the same. While not wanting to be limited to any particular theory, operation uses energy to lower entropy on some device surfaces and transfer lowered entropy to a gas in contact with the surface. The device can optionally donate energy to the gas by raising the gas temperature. The function of the NMSet may be therefore divided into three areas: the means by which entropy on surfaces of the device is lowered, the means by which the lowered entropy is transferred to the gas, and the optional means by which the gas temperature is increased.

Temperature Differential

A temperature differential between layers of material is generally required for an NMSet or related device to operate. In preferred embodiments described herein, a temperature differential can be established in a solid-state electrodynamic mechanism, i.e. the "Se" of NMSet. However, the devices and methods described here are not limited to electronic or purely solid state devices. For example, a temperature differential may be established by conduction of heat from combustion using a fluid coolant, exothermic chemical reaction, or other chemical source. A temperature differential may be established by simple resistive heating, by the Peltier effect, by the thermo-tunneling enhanced Peltier effect, or by any other suitable means, such as explained below. A means by which the temperature differential is established between two objects can be phenomenologically described by two characteristics: entropy-reduction (heat transfer between the two objects), and diabaticity (total heat transfer between environment and the two objects).

In one embodiment, the Peltier effect can be used to establish a temperature differential. The Peltier effect occurs when an electric current is applied through a loop composed of two materials with different Peltier coefficients joined at two junctions. Depending on the direction of the electric current, heat flows from one junction to the other, causing a temperature differential to be established between the junctions. The Peltier effect can be understood as follows: Heat capacity of charge carriers in a material is characterized by the Peltier coefficient Π, which is the amount of heat carried per unit charge carriers in the material. When an electric current I flows through a junction of material A with Peltier coefficients $\Pi_A$ and material B with Peltier coefficient $\Pi_B$, the amount heat carried by charge carriers to the junction in a unit time is $I \times (\Pi_A - \Pi_B)$.

The Peltier effect reduces entropy locally and is adiabatic. Assuming Joule heating can be ignored, in the Peltier effect, heat is transferred from one junction to another, but no heat is added into the loop of the two materials. This entropy reduction can provide for advantages in the stackability of NMSet and related devices. Consequently, the Peltier effect lends itself particularly well to some embodiments.

In this embodiment, a power source drives an electric current between two surfaces. Charge carriers such as electrons and/or holes carry heat as they flow in the electric current, and thus create a temperature differential between the two surfaces. Entropy is reduced as the temperature differential is established.

Phonon flow reduces the temperature differential established by the Peltier effect. If phonons are permitted to flow freely (i.e., infinite thermal conductivity or zero heat capacity), their flow will cancel the temperature differential established the Peltier effect. Efficiency of the Peltier effect can be increased by reducing electrical resistance and thermal conductance.

Figure 6:
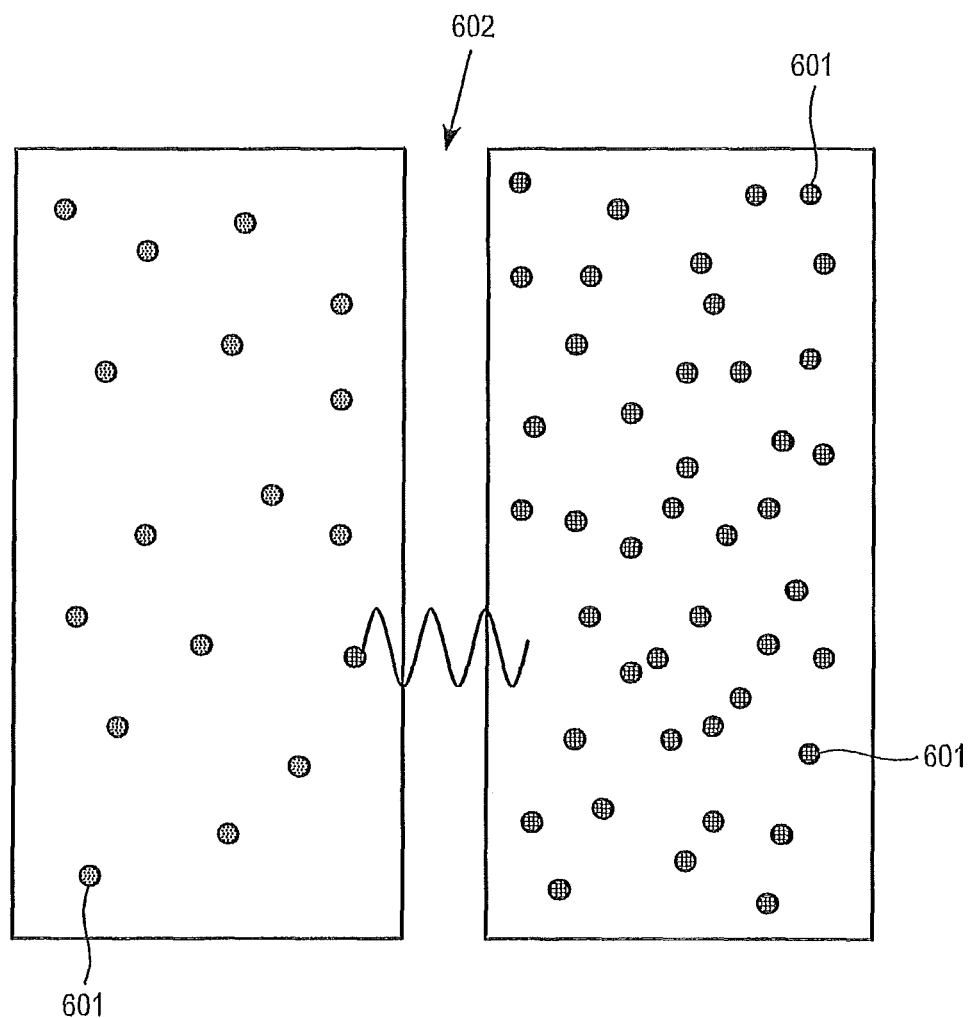
FIG. 6 shows the thermo-tunneling enhanced Peltier effect.

One way to reduce thermal conductance is to place a narrow vacuum gap in the path of the electric current. Phonons cannot easily pass the vacuum gap but charge carriers can do so under a voltage across the vacuum gap. This is called thermo-tunneling enhanced Peltier effect (or thermotunnel cooling). FIG. 6 shows a diagram of the thermo-tunneling enhanced Peltier effect. Charge carriers 601 can tunnel through a vacuum gap 602.

The thermo-tunneling enhanced Peltier effect is generally only significant at high temperatures or voltages, unless enhanced by choice of surface geometry and materials that can restrict behavior of charge carriers near the vacuum gap and increase tunneling probability. For example, suitable surface coatings and structures can function as a filter that do not allow low energy states of charge carriers but only high energy states of charge carriers near the vacuum gap.

In another embodiment, a temperature differential can be created and maintained by field-enhanced thermionic emission. Thermionic emission is a heat-induced flow of charge carriers over a potential-energy barrier. The charge carriers can be electrons or ions (i.e. thermions). In a simple approximation, the potential-energy barrier acts like a dam, in that it withholds carriers with thermal energy less than its height and allows carriers with thermal energy greater than its height to flow over. When the overflowing carriers pass the potential-energy barrier, heat is carried away with them. The carriers left behind the potential-energy barrier re-thermalize (redistribute in energy) to a lower temperature. Thermionic emission typically requires an operating temperature of several hundred degrees Celsius so that a non-negligible fraction of the carriers has thermal energies great enough to overcome the potential-energy barrier. An electrical field can assist thermionic emission by reducing the height of the potential-energy barrier and reducing the required operating temperature.

A temperature differential in an NMSet or related device can also be established by using resistive heating (explained below) and/or by suitable chemical processes. In order to maintain the temperature differential without raising the overall temperature of the device, some cooling means can also be provided, such as a heat sink exposed to atmosphere. No matter what cooling means is used, the temperature differential is more pronounced if warmer surfaces of the device are not cooled as efficiently as cooler surfaces, which can be achieved, for example, by thermal insulation.

Force Generation

In one aspect, the production of net thrust may by thought of as the transfer of the reduced entropy from an established temperature differential to a gas. Without wishing to be bound by theory, consider a single device operating in a gas, as an adiabatic process. In this example, a temperature differential between a hot and a cold layer can be established by a suitable means such as the Peltier effect. For simplicity, assume no net heat transfer between the gas and the device. Particles of the gas will impact the hot and cold layers with equal probabilities, and their interaction with these layers will have consequences on local momentum space of the gas near surfaces of the hot and cold layers. The local momentum space of the gas very close to a surface of the hot and cold layers has nonzero expectation value when the gas and the surface have different temperatures. Assuming also that no gas particles penetrate the surface, the gas particles rebound from the surface with momenta different from their incident momenta, which skews the momentum space along the surface normal, and the magnitude of the skew is directly related to the temperature difference between the surface and the gas.

In an arrangement with random geometry (i.e. surface normals at different surface locations point to random directions), the weighted sum of expectation values of local momentum spaces of the gas is nearly zero, which results in almost no net thrust. In an NMSet with an optimized geometry, however, the weighted sum of expectation values of local momentum spaces of the gas can be non-zero, which leads to a net thrust.

A trivial example of an arrangement that has non-zero net thrust is shown in FIG. 1, as described above. This geometry is not very efficient because macroscopic convective gas flows and vortex formation increase the entropy and limit the amount of useful work. Exemplary convective gas flows 120, 130 are shown in FIG. 2. Gas at ambient temperature 110 flows towards the cold layer 101 and gets cooled. Cooled gas flows 120 away from the cold layer 101 and around the edge of the Peltier slab 100 towards the hot layer 102. Heated gas flows 130 away from the hot layer 102.

To simplify the description, it may be helpful to think about the system in terms of Newton's second law and the kinetic theory of gases. Around the Peltier slab 100 in FIGS. 1 and 2, assuming that temperature of the gas is bracketed by the temperatures of the layers 101 and 102, gas particles that collide with the layer 101 leave the layer 101 with greater momentum than before the collision. Similarly, gas particles that collide with the layer 102 leave the layer 102 with lesser momentum than before the collision. Since gas pressure is directly related to momenta of gas particles, gas near the layer 102 has higher pressure than gas near the layer 101. This pressure bias pushes the entire slab 100 in the y direction.

In another embodiment, the Peltier slab 100 can have at least one through hole between the layer 101 and 102. Gas spontaneously flows from the layer 101 to the layer 102 through the hole which enables higher heating rate of the gas. Such flow of gas is referred to as thermal transpiration. Assuming gas near the layer 101 has temperature of $T_c$ and pressure of $P_c$, and gas near the layer 102 has temperature of $T_h$ and pressure of $P_h$, thermal transpiration causes the gas to flow from the layer 101 to the layer 102 through the hole, if the following equation is satisfied:

$$\sqrt{\frac{T_h}{T_c}} \geq \frac{P_h}{P_c} \quad [1]$$

In order to improve efficiency, it is helpful to understand where the classical limit exists within gas flows. Convective descriptions of gas flow break down at around length scales where the Knudsen number vanishes. As a result, in some aspects, the mean free path of a gas becomes a useful parameter in determining advantageous geometries of an NMSet.

Figure 3:
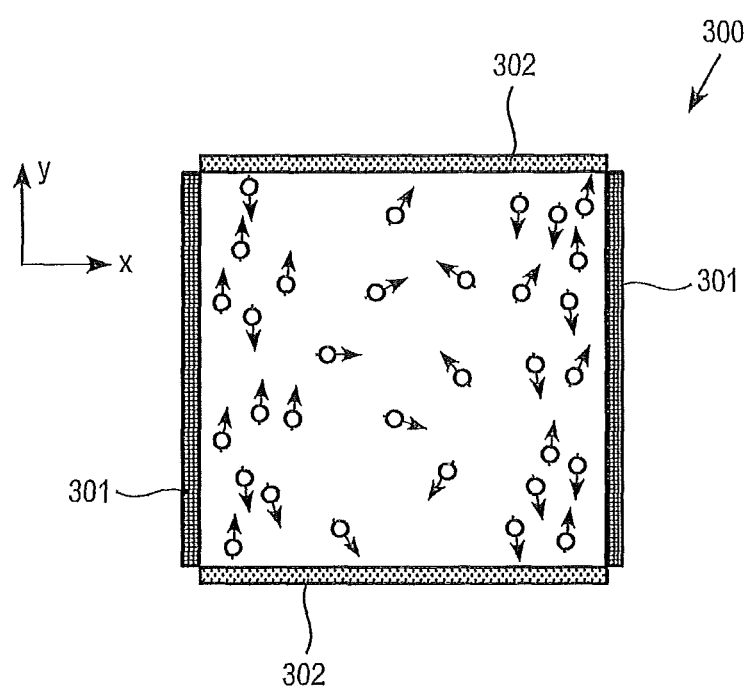
FIG. 3 shows a gas confined in a square box with parallel hot walls and parallel cold walls.

For instance, consider a gas at a particular pressure having a mean free path of 10 nm. If a cloud of such gas is trapped in a two dimensional square 20 nm by 20 nm box as shown in FIG. 3, a gas particle, within 10 nm of travel, will be approximately as likely to have struck another gas particle as it is to have struck the walls of the box. If the walls of the box are heated, then smaller boxes will reach thermodynamic equilibrium with gas therein faster than larger boxes, because gas particles in smaller boxes have more chances to collide with and exchange heat with the walls. Generally, when most of collisions in a gas are between gas particles and a surface, then thermodynamic equilibrium can be achieved approximately in the mean free time (the time it takes a gas particle to travel the mean free path).

Figure 16:
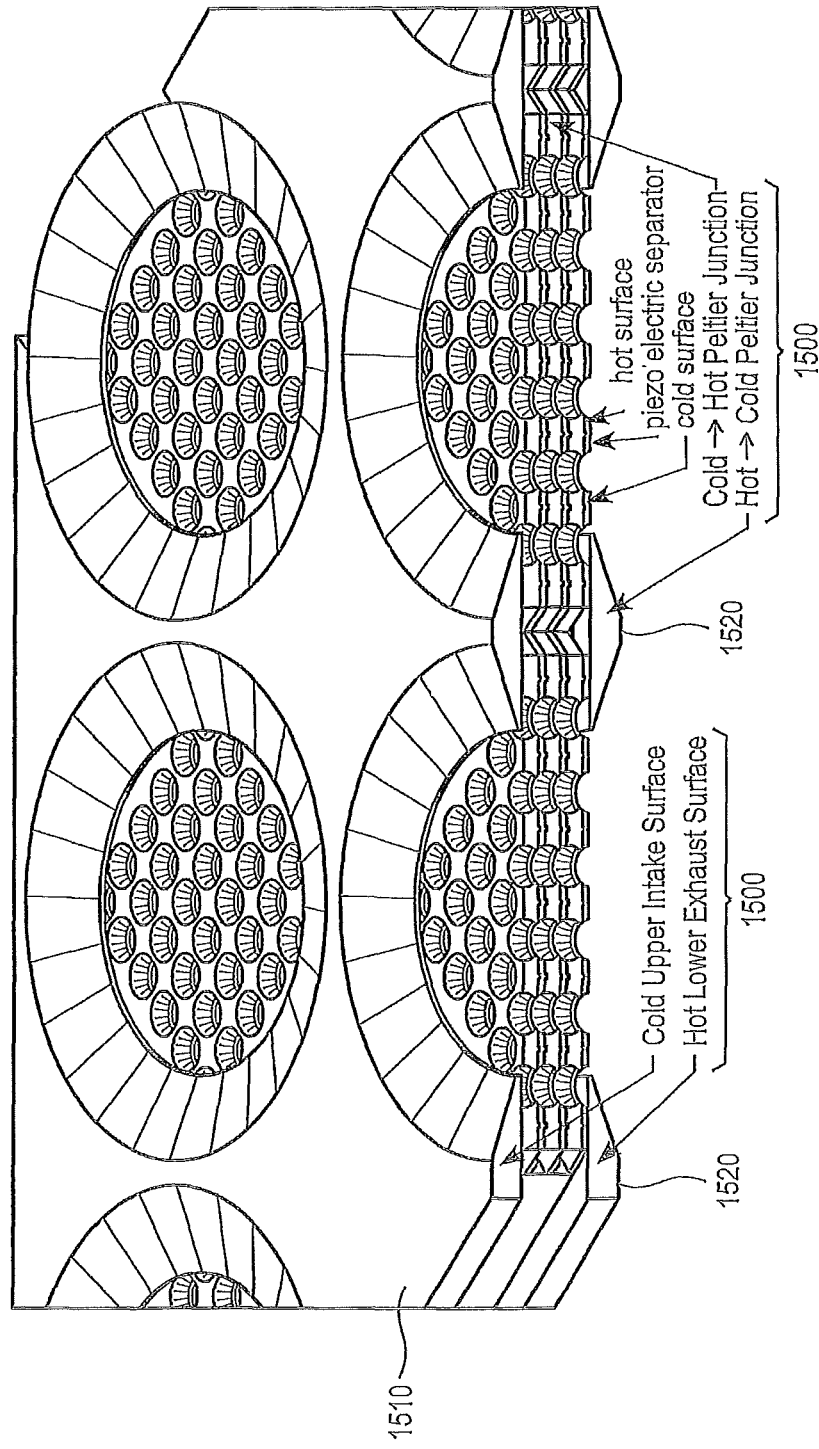
FIG. 16 shows a cross sectional view of the NMSet with an external Peltier arrangement of FIG. 15.
Figure 17:
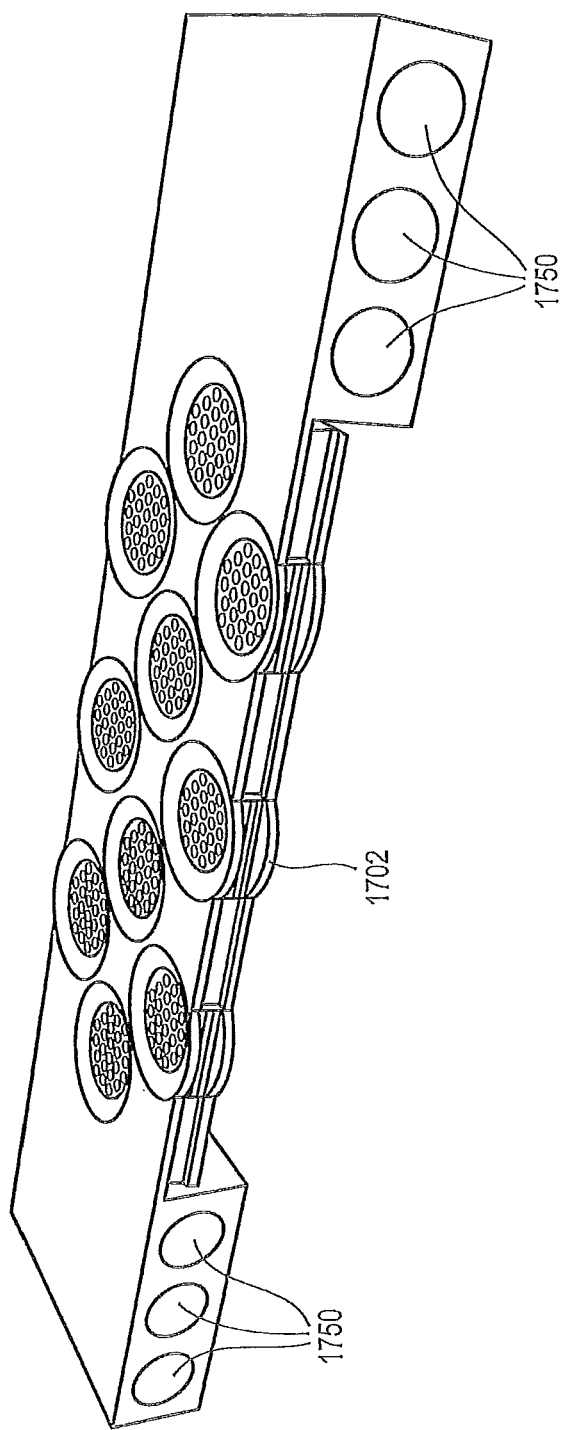
FIG. 17 shows a perspective view of an NMSet with an external non-Peltier arrangement.
Figure 18:
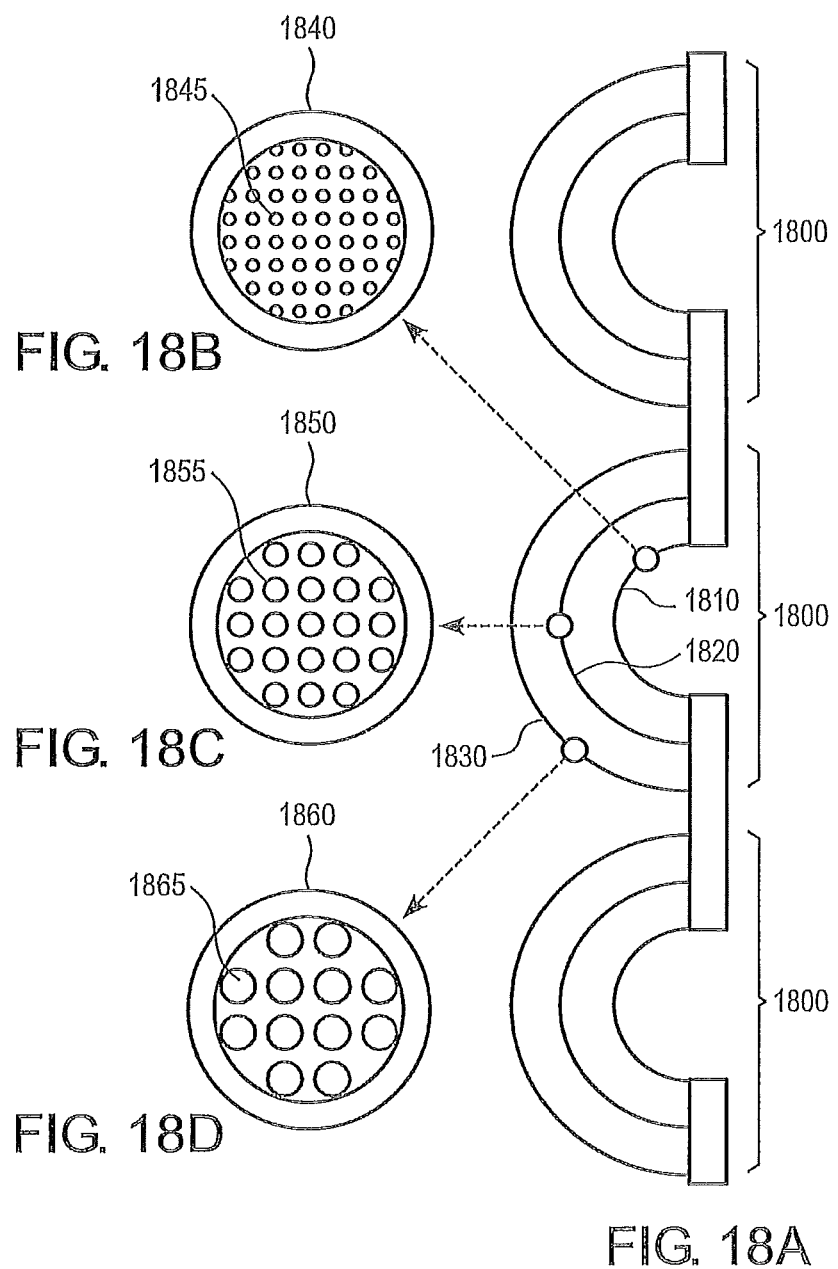
FIG. 18 shows a cross sectional view of a staged NMSet arrangement.

For this reason, in some embodiments, the characteristic scale of individual features of NMSet and related devices may be nanoscale, i.e., the "NM" of NMSet. However, it must be understood that the methods and devices described here are not limited to nanoscale embodiments. The mean free path parameter is dependent on gas density so that in some embodiments and uses, larger scale features may be employed. Furthermore, as described herein, pluralities of NMSet and related device elements can be combined to provide action over a large surface. For example, NMSet or related devices may advantageously be arranged in arrays and arrays of arrays to provide directed movement of gas over across large surfaces, for examples as illustrated in FIGS. 16 and 17. NMSet or related device elements can also be arranged in one or more stages to achieve a greater pressure differential, for example as illustrated in FIGS. 18A-18D. FIG. 18A illustrates a cross sectional view of an array of staged NMSet or related devices arrangements 1800. Each staged arrangement 1800 is composed of stages 1810, 1820, 1830 of in the form of concentric half-spheres containing arrays of NMSet or related devices 1840, 1850, 1860 illustrated in blow-up in FIGS. 8B-18D. Individual NMSet apertures 1845, 1855, 1865 in each stage increase in size in accordance with the decreasing ambient pressure that would be experience at each subsequent stage in operation.

Surface Interaction

Interaction between surfaces can affect the momentum space transformation matrix A. If nearby surfaces can easily exchange phonons via gas particles, then the entropy at these surfaces will locally increase at a higher rate than surfaces which cannot easily exchange phonons via development of vortexes. This will generally reduce the efficiency of a system.

One method by which phonon exchange may be reduced is to limit or eliminate any shared bases between surfaces. For instance, consider gas particles in the box 300 in FIG. 3. Box 300 comprises two planar hot walls 302 parallel to each other, and two planar cold walls 301 parallel to each other and perpendicular to the walls 302. If the box 300 is comparable in size to the mean free path of the gas particles therein and the walls 301 and 302 are perfectly specular, the gas particles can reach thermal equilibrium with the cold walls 301 and the hot walls 302 independently. This is because surface normals of the walls are only shared between the two cold walls 301 or between the two hot walls 302, but not between a hot wall 301 and a hot wall 302. Consequently, no momentum can be exchanged between the hot walls 302 and the cold walls 301 by the gas particles. This is because interaction between the gas particles and the cold walls 301 only affect momenta in the x direction but not momenta in the y direction; and interaction between the gas particles and the hot walls 302 only affect momenta in the y direction but not momenta in the x direction and the fact that momenta in the x direction are orthogonal with momenta in the y direction. After thermal equilibrium is reached between the gas particles and the walls, the gas particles move faster in the x direction than in the y direction.

As a practical matter, surfaces are usually not perfectly specular. However, specular surface properties exist very strongly in some materials so that there are angles for which convective flows in corners may be reduced. This effect is generally observed when the Knudsen numbers are large, which is a preferred condition for NMSet and related devices, particularly in nanoscale embodiments. The Knudsen number (Kn), named after Danish physicist Martin Knudsen (1871-1949), is a dimensionless number defined as the ratio of the molecular mean free path to a representative physical length scale. In an NMSet or the related devices discussed here, the representative physical length scale is taken to be the order of magnitude of the aperture diameter of the device, i.e. the representative physical scale length is a nanometer if the aperture is measured in nanometers and a micrometer if the aperture is measured in micrometers. In preferred methods of using the devices disclosed herein the Knudsen number is preferably greater than 0.1, or greater than 1, or greater than 10.

Methods of Optimizing NMSet and Related Devices

Modeling

Performance of an NMSet with a specific geometry can be simulated by a Monte-Carlo method for optimization. Specifically, a simulation for an NMSet or related device with any given geometry starts with a group of gas particles with random initial positions and momenta around the device. Positions and momenta of these particles after a small time interval are calculated from the initial positions and momenta, using known physical laws, parameters such as temperature, pressure, chemical identity, geometry of the device, interaction between surfaces of the device and the gas particles. The simulation is run through a chosen number of iterations and simulation results are analyzed. The geometry of the device can be optimized using simulation results. In preferred embodiments, a device is constructed using the results of the simulation analysis.

In a preferred embodiment, a simulation can be represented in the following table:

Algorithm 1 EVOLVE MODEL(M, P, k)

M←0
P←a set of search parameters
k←number of iterations
for i = 1 to k do
V←An instance of P
V←V perturbed by M
E←MONTE CARLO(V)
Update M using E
end for A perturbation model M is evolved through a number (k) of iterations. First, M is initialized to an empty set, indicating no solution knowledge. Then, a loop is started in which the search parameters generate an arbitrary element from the definite search space P and the prior learned knowledge M is used to perturb P. The specific algorithm used to perturb as an implementation detail.

If run in a grid computing environment, M should ideally be identical among all nodes, but this is not necessary due to the inherently stochastic nature of the process. The step of EVOLVE_MODEL which actually runs the Monte-Carlo simulation is the most computationally expensive of all by far and offers a lot of time to synchronize M.

Specific parameters depend on the environment. The parameters that the user can specify include the following:
1. Molecular diagrams, in some embodiments containing up to three atoms, such as $CO_2$ or $H_2O$.
2. Partial concentrations for constituent molecules.
3. Initial temperature and pressure of the entire gas.

In a stationary simulation, the Monte-Carlo simulation can be run with periodic bounds in all axes. In the y axis, however, particles encountering the periodic bound are stochastically thermostatted according to temperature and pressure settings in order to simulate ambient conditions. In the x axis, particle velocities are unmodified in order to simulate a periodic ensemble of identical device assemblies along that direction. The simulation may be run in two dimensions to reduce the computational complexity of the simulation. A three dimensional simulation should give similar results where the modeled device has cylindrical symmetry. Note that in general, a simulator does not have to use the periodicity as indicated here and may not specify any boundaries at all; they are only defined as a computational convenience.

In preferred embodiments, potential device geometries can be evaluated in consideration of the conditions under which a device will be used and known surface reflection properties of the material from which it will be constructed. Geometrical parameters can be optimized by analyzing results from simulation before the geometry is actually used in manufacture of NMSet and related devices.

Example Geometries

Four embodiments with different geometries are particularly discussed below. These four geometries will be referred to as Straight, Parabolic, Triangular, and Sawtooth. It must be noted that the geometries of the NMSet and related devices described here can vary considerably and these examples should be taken only as illustrations for the purpose of discussing the effects of certain design choices on system efficiencies.

Straight

Figure 19:
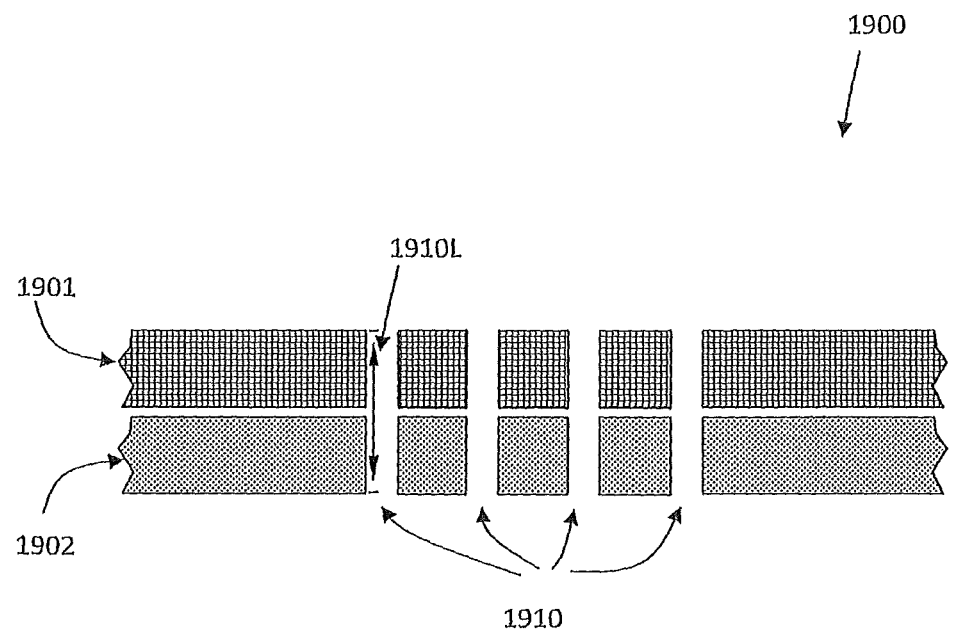
FIG. 19 shows an NMSet with a straight geometry.

FIG. 19 shows an embodiment of an NMSet or related device 1900 with a straight geometry. In this embodiment, the device 1900 comprises a hot layer 1902 and a cold layer 1901. The terms "hot layer" and "cold layer" mean that these layers have a temperature difference therebetween, not that the "hot layer" is necessarily hotter or the "cold layer" is necessarily colder, than a gas the NMSet or related device is immersed in. At least one straight through hole 1910 extends through all layers of the device 1900 and preferably has the same cross-sectional shape and size on each layer. The straight through hole 1910 can have any cross-sectional shape such as circular, slit, and comb.

Preferably, a total length 1910L (i.e. a distance from one entrance to the other entrance) of the straight through hole 1910 is up to 10 times, up to 5 times or up to 2 times of the mean free path of a gas in which the device 1900 is immersed. The mean free path of air at the standard atmosphere pressure is about 55 nm. At higher altitude, the mean free path of air increases. For atmospheric applications, the total length 1910L is preferably not greater than 1500 nm. A temperature differential between the hot layer 1902 and the cold layer 1901 is preferably at least 0.5° C., more preferably at least 30° C., more preferably at least 50° C., and most preferably at least 100° C.

The hot layer 1902 and the cold layer 1901 may be separated by a gap therebetween for thermal isolation. The gap preferably is a vacuum gap and/or contains a thermal insulator. In one examples, the gap contains a plurality of thin pillars made of a good thermal insulator such as silicon dioxide.

The device 1900 has preferably at least 10 straight through holes per square centimeter. A total perimeter length of all the straight through holes of the device 1900 per square centimeter is preferably at least two centimeters.

Parabolic

Figure 7:
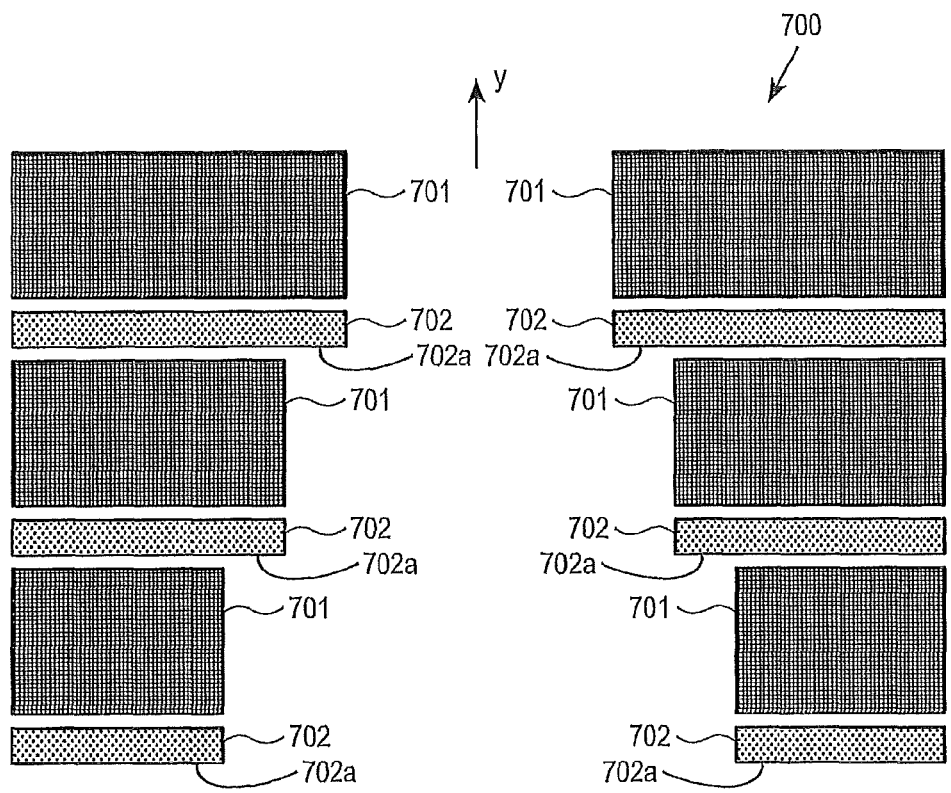
FIG. 7 shows a stack of NMSets with a parabolic geometry.
Figure 8:
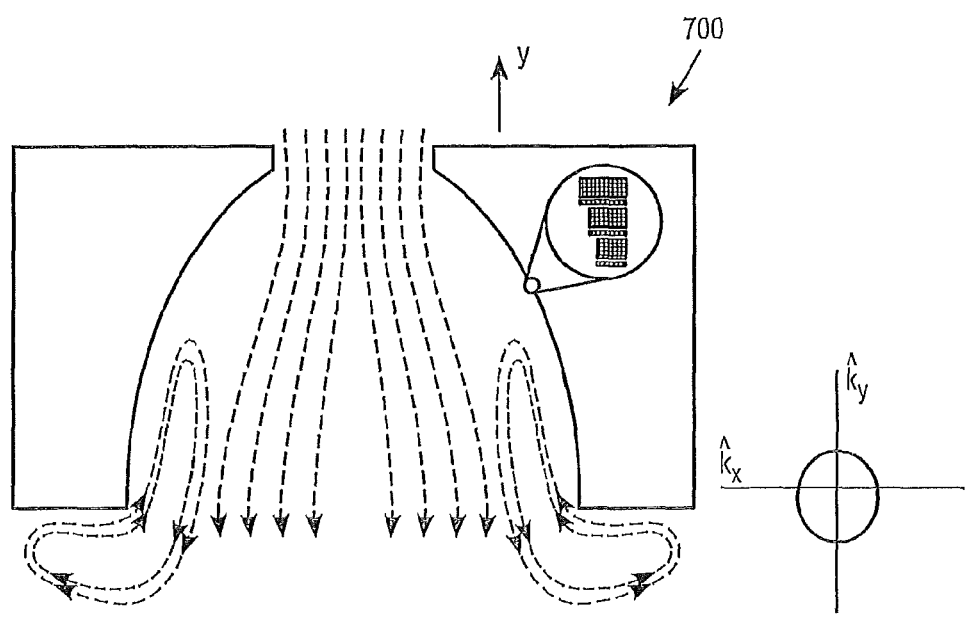
FIG. 8 shows gas flow patterns around the stack of NMSets of FIG. 7 and the momentum space of the gas.

FIG. 7 shows an embodiment of an NMSet or related device 700 with a parabolic geometry. In this embodiment, alternating hot layers 702 and cold layers 701 are stacked. In the illustration, each hot layer 702 and cold layer 701 has a straight through hole. All the holes are aligned. The hole in each hot layer 702 has the same size as the hole in the cold layer 701 immediately above, and is smaller than the hole in the cold layer 701 immediately below. Each cold layer 701 is colder than its immediate adjacent hot layers 702 and each hot layer 702 is hotter than its immediate adjacent cold layers 701. A surface 702a of each hot layer 702, which has a surface normal in the −y direction, is exposed. All the holes collectively form a nozzle with a contour of a parabolic surface. This geometry minimizes shared bases between the hot and cold layers. However, because an NMSet or related device does not necessarily increase the energy of the gas, the increasing hole diameter results in a drop in gas pressure. This can create strong vortexes near the lower aperture, which lower total efficiency. An NMSet with the parabolic geometry can be adiabatic or isobaric, but not both. An approximation of gas flow in an NMSet or related device with the parabolic geometry is shown in FIG. 8. The momentum space of the gas is skewed such that the expectation value of the momentum points to the −y direction.

Although the parabolic geometry is effective in an NMSet or related device, a drop in gas pressure puts an upper bound on the size of the lower aperture. In general, any adiabatic device in which the gas being moved undergoes a change in volume will suffer in its efficiency.

If the temperature differential in a device with the parabolic geometry is established by a diabatic means (i.e. the device raises the overall temperature of the gas), then the NMSet with the parabolic geometry may not suffer in its efficiency from the gas undergoing a change in volume, as long as the amount of heat added to the gas is sufficient to prevent the formation of vortexes. However, such a device suffers in its efficiency from higher total entropy, i.e. the eigenvectors of the momentum space of the gas are not as far apart if the gas has to expand, but supplying heat at small scales is typically easier than carrying it away.

Triangular

Figure 9:
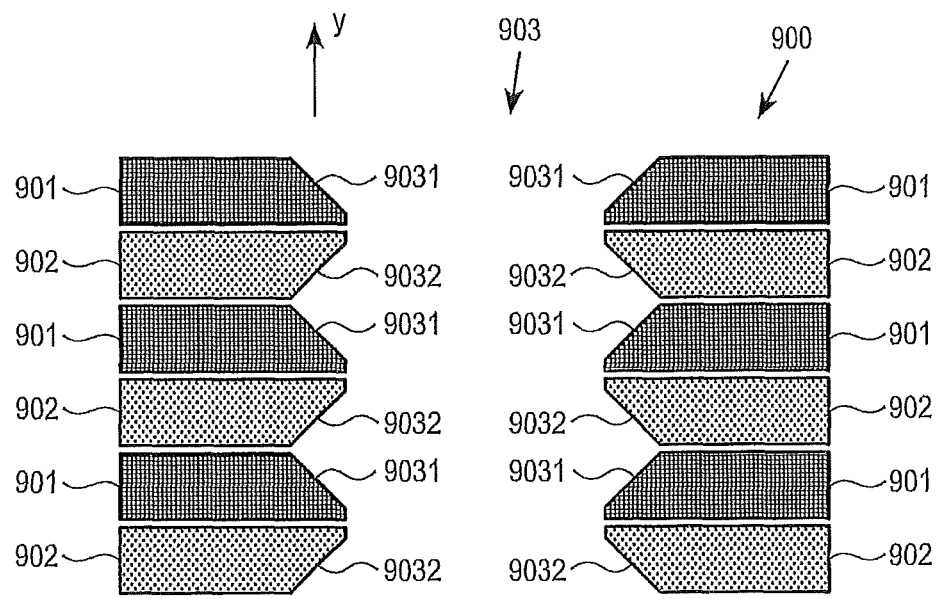
FIG. 9 shows a stack of NMSets with a triangular geometry.

The triangular geometry detailed in FIG. 9 is a partial optimization of the parabolic geometry for adiabatic flows. In this case, the gas is not permitted to experience a sufficient expansion to trigger large-scale vortex generation. Furthermore, because the apertures do not change size, a triangular arrangement such as this one may be easily stacked.

Figure 10:
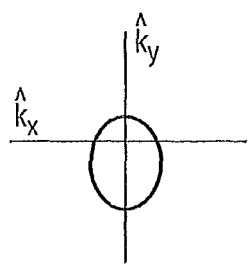
FIG. 10 shows the momentum space of the gas around the stack of NMSets with a triangular geometry.

The momentum space of this triangular geometry is more efficiently biased, as is illustrated in FIG. 10. As in the parabolic arrangement, the exposed hot and cold surfaces meet at preferably a 90-degree angle, however, a source of inefficiency arises when particles carry heat back and forth between surfaces across the center gap.

FIG. 9 shows a stack 900 of NMSet or related device with the triangular geometry. Each device in the stack 900 comprises a hot layer 902 and a cold layer 901 of equal thickness. The temperature differential between the cold and hot layers 901 and 902 can be established by any suitable means such as the Peltier effect. Each device has a through hole 903. Each though hole 903 has a 45° chamfer (9031 and 9032) on each entrance. The width of the chamfers 9031 and 9032 is from 1.40 to 1.42 times of the thickness of the cold and hot layers 901 and 902. The through holes 903 in all layers in the stack 900 are aligned. In general, the temperatures of the hot layers 902 in a device in the stack 900 do not increase monotonically from one side of the stack to the other side. In general, the temperatures of the cold layers 901 in a device in the stack 900 do not decrease monotonically from one side of the stack to the other side. Preferably, each cold layer 901 is colder than its immediate adjacent hot layers 902 and each hot layer 902 is hotter than its immediate adjacent cold layers 901.

Sawtooth

Figure 11:
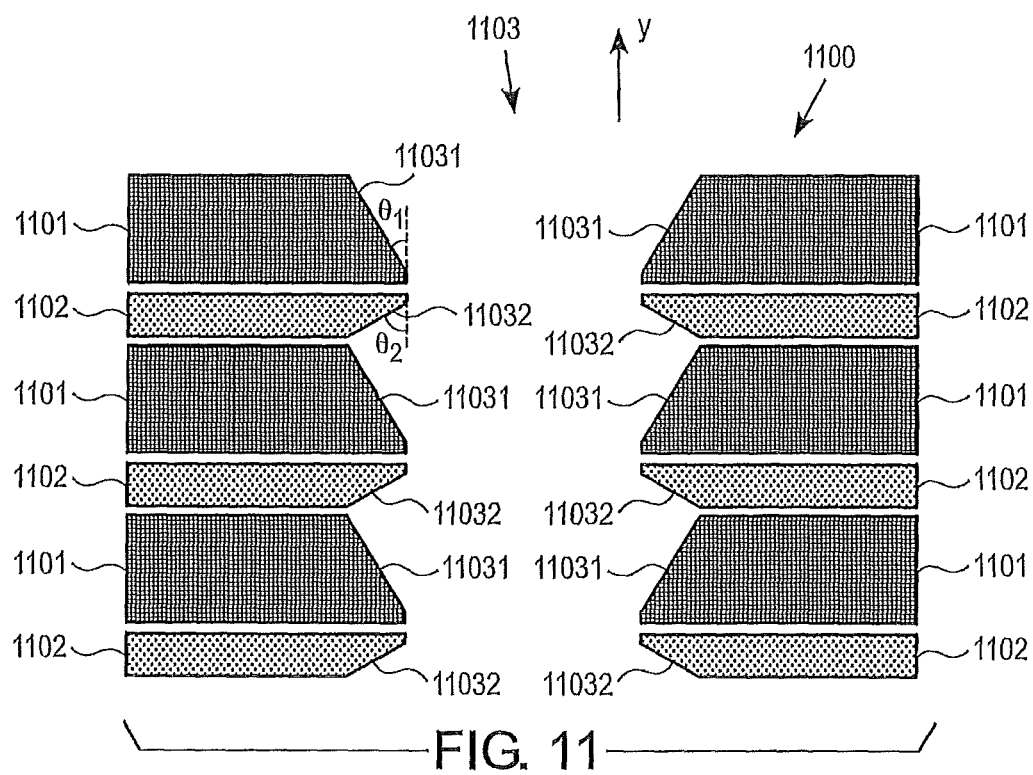
FIG. 11 shows a stack of NMSets with a sawtooth geometry.

FIG. 11 shows a stack 1100 of NMSet or related device with a sawtooth geometry. Each device in the stack 1100 comprises a hot layer 1102 with a thickness of $t_h$ and a cold layer 1101 with a thickness $t_c$. The temperature differential between the cold and hot layers 1101 and 1102 can be established by any suitable means such as the Peltier effect. Each device has a through hole 1103. In the illustrated device, each through hole 1103 has a chamfer 11031 at the entrance on the side of the cold layer 1101, and a chamfer 11032 at the entrance on the side of the hot layer 11032. An angle between the chamfer 11031 and a center axis of the through hole 1103 is $\theta_1$; an angle between the chamfer 11032 and a center axis of the through hole 1103 is $\theta_2$. The sum of $\theta_1$ and $\theta_2$ is preferably from 85° to 95°, more preferably from 88° to 92°. The ratio of $t_c$ to $t_h$ is substantially equal to the ratio of cotangent of $\theta_1$ to cotangent of $\theta_2$. $\theta_2$ is preferably from 70° to 85°.

The relationships of the chamfer angles described here are preferred limitations, not hard boundaries. In general for materials exhibit perfectly specular molecular reflection properties, the relationships of the chamfer angles can be slightly relaxed. For materials exhibit less than perfectly specular molecular reflection properties, the relationships shall be stringent. The chamfer geometries are preferably arranged so as to minimize shared bases. The surface normals of the specularly reflecting chamfer surfaces can thus preferably be orthogonal. Deviations from orthogonality can incur a penalty in efficiency as a cosine function. For engineering reasons, the hot and cold surfaces of the sawtooth arrangement may not come to a fine point.

In the illustrated device, the through holes 1103 in all layers in the stack 1100 are aligned. Temperatures of the hot layers 1102 in each device in the stack 1100 do not increase monotonically from one side of the stack to the other side. Temperatures of the cold layers 1101 in each device in the stack 1100 do not decrease monotonically from one side of the stack 1100 to the other side. Each cold layer 1101 is colder than its immediate adjacent hot layers 1102 and each hot layer 1102 is hotter than its immediate adjacent cold layers 1101.

The sawtooth geometry shown in FIG. 11 offers an improvement over the triangular geometry in that all hot layers 1102 are preferably oriented in nearly the same direction (i.e. $\theta_2$ is preferably nearly 90°). This reduces direct interaction between hot and cold layers 1102 and 1101 across the through hole 1103, and improves overall efficiency.

Figure 12:
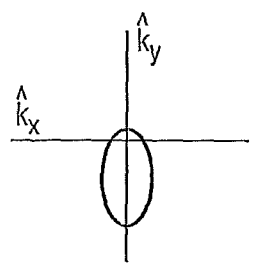
FIG. 12 shows the momentum space of the gas around the stack of NMSets with a sawtooth geometry.

Furthermore, because the hot layers 1102 have a lower exposed surface area than the cold layers 1101, and because the cold layers 1101 are preferably oriented at a shallower angle relative to the center axis of the through hole 1103 than in the triangular geometry, the sawtooth geometry is capable of reducing the entropy in the gas (and thereby causing it to do more work) more efficiently than the triangular geometry. The momentum space of this sawtooth geometry is more efficiently biased than the momentum space of the triangular geometry, as is illustrated in FIG. 12.

In the triangular configuration, device slices on opposite sides of a cross section have a magnitude of $1/\sqrt{2}$ in the y axis because their separation angle 90 degrees. This limits the efficiency of entropy reduction, as some of the entropy is going to neutralized in direct inter-surface interaction.

In the sawtooth configuration, however, the hot layers 1102 not only share no basis with the adjacent cold layers 1101, but also share very little basis with hot and cold layers across the through hole 1103. This combined property makes the sawtooth geometry more efficient than the triangular geometry.

Figure 4:
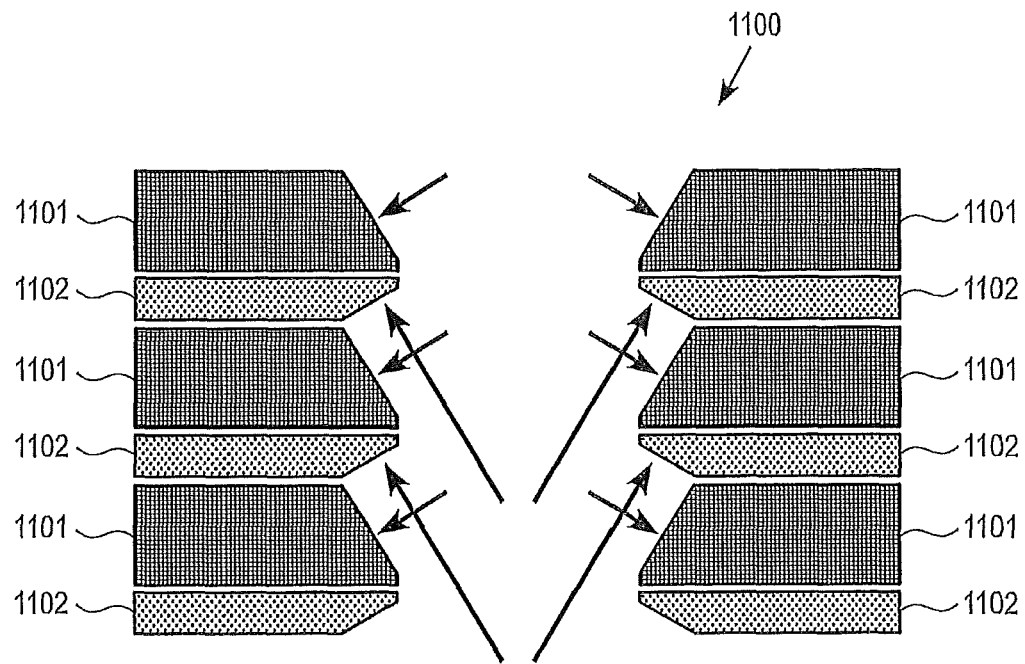
FIG. 4 shows net forces on a stack of NanoMolecular Solid State Electrodynamic Thrusters (NMSets) with sawtooth geometry.
Figure 5:
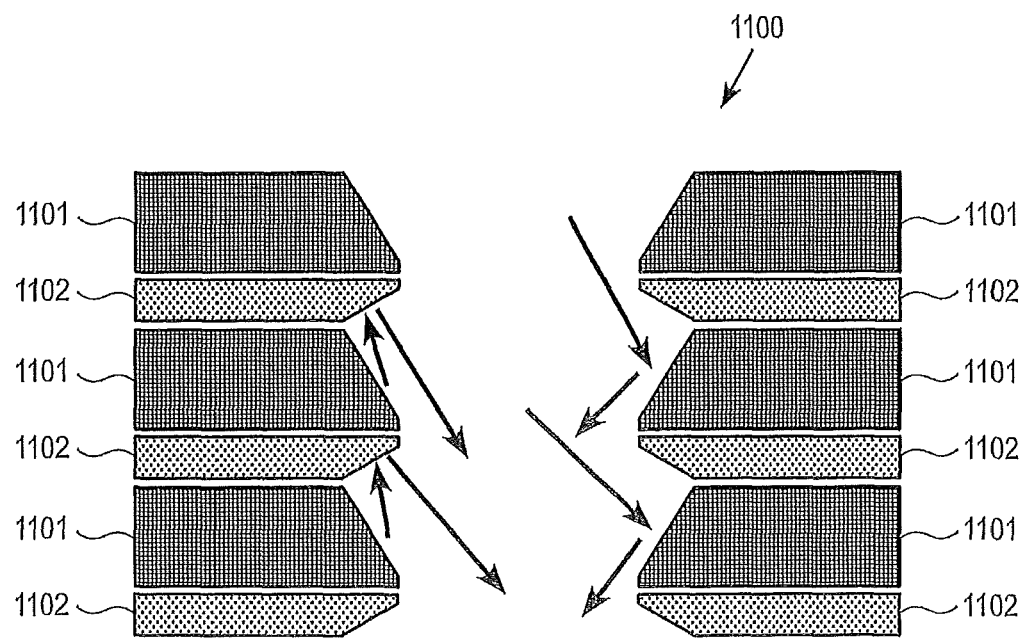
FIG. 5 shows gas particle velocities around a stack of NMSets with sawtooth geometry.

After an NMSet or related device is powered (i.e. temperature differential is established), gas particles rebounding from cold layers have a lower net velocity, while gas particles rebounding from hot layers have higher net velocity. FIG. 4 shows net forces the layers of the stack 1100 (sawtooth geometry) experience. In a stable state, a vacuum is generated at the entrance aperture (upper aperture in FIG. 4) which in turn generates a corresponding low-pressure region above the stack 1100, and a high-pressure region below the stack 1100. Gas particle velocities of the stack 1100 resulting from the gas pressure distribution are shown in FIG. 5.

Means for Establishing Temperature Differential

Internal Peltier

According to one embodiment, each element in the device geometry acts both as a particle director and as the entropy reducer. In a Peltier device, the hot and cold plates are made of materials with different Peltier coefficients. Electrical current is made to flow between the cold and hot plates. This flow of current carries with it Peltier heat, establishing the temperature differential necessary to operate the device. In some embodiments, piezoelectric spacers can be disposed between device elements to maintain the separation gaps therebetween.

Figure 13:
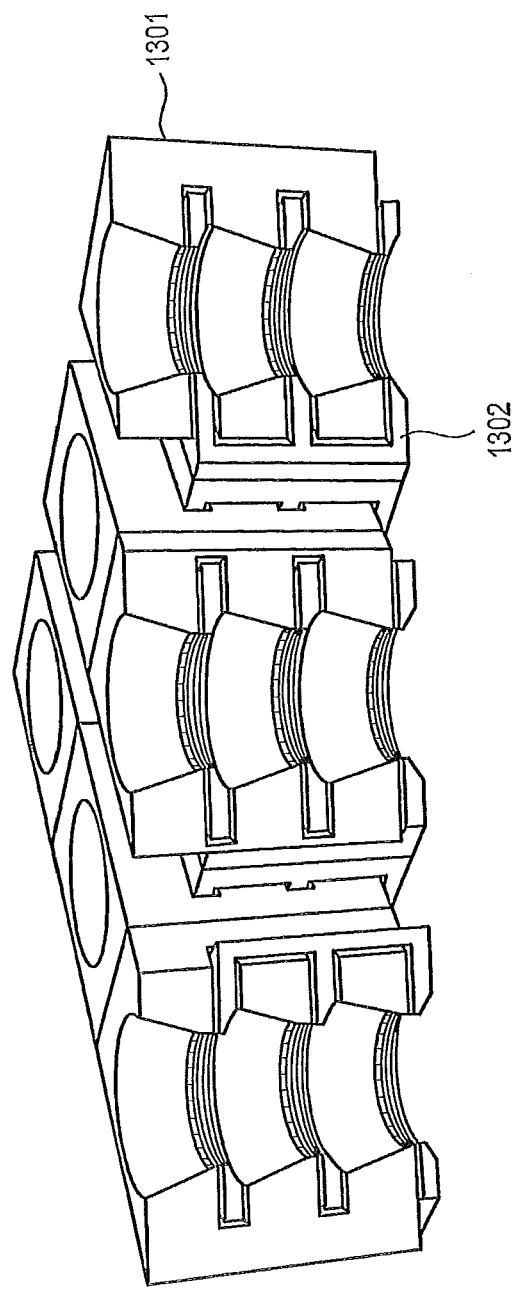
FIG. 13 shows a cross sectional view of an NMSet with an internal Peltier arrangement.
Figure 14:
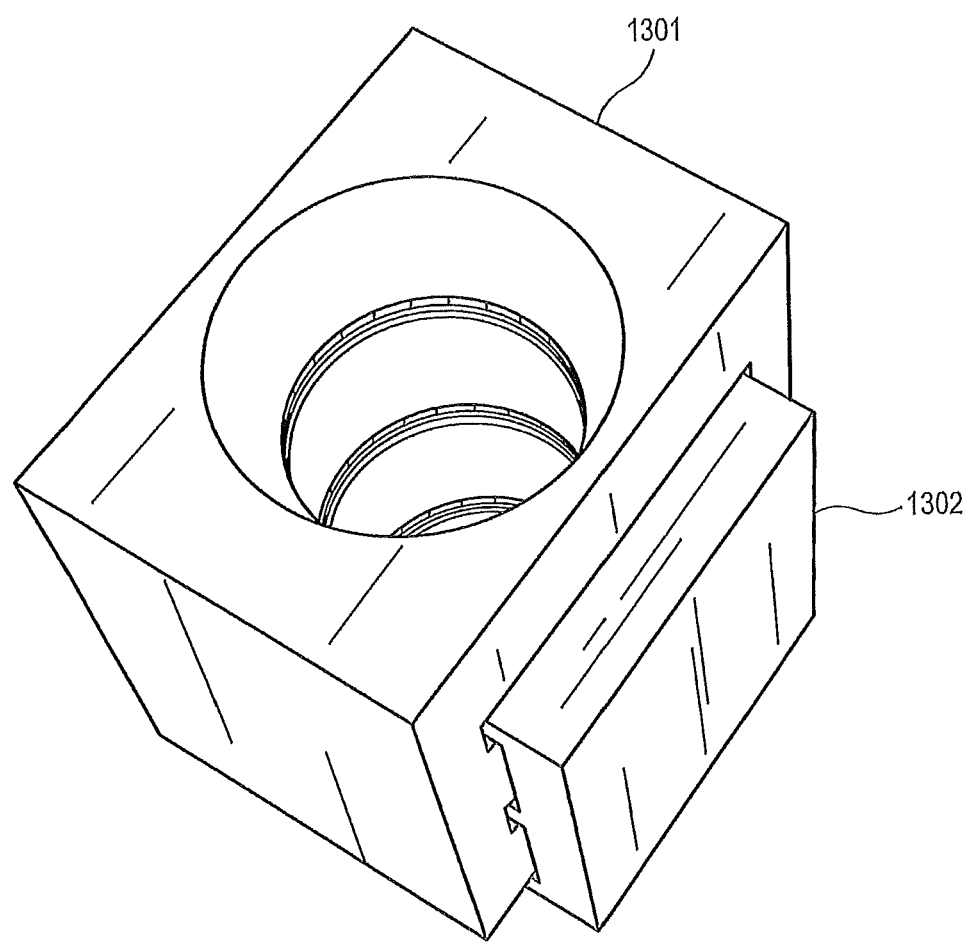
FIG. 14 shows a perspective view of the NMSet with an internal Peltier arrangement on FIG. 13.
Figure 15:
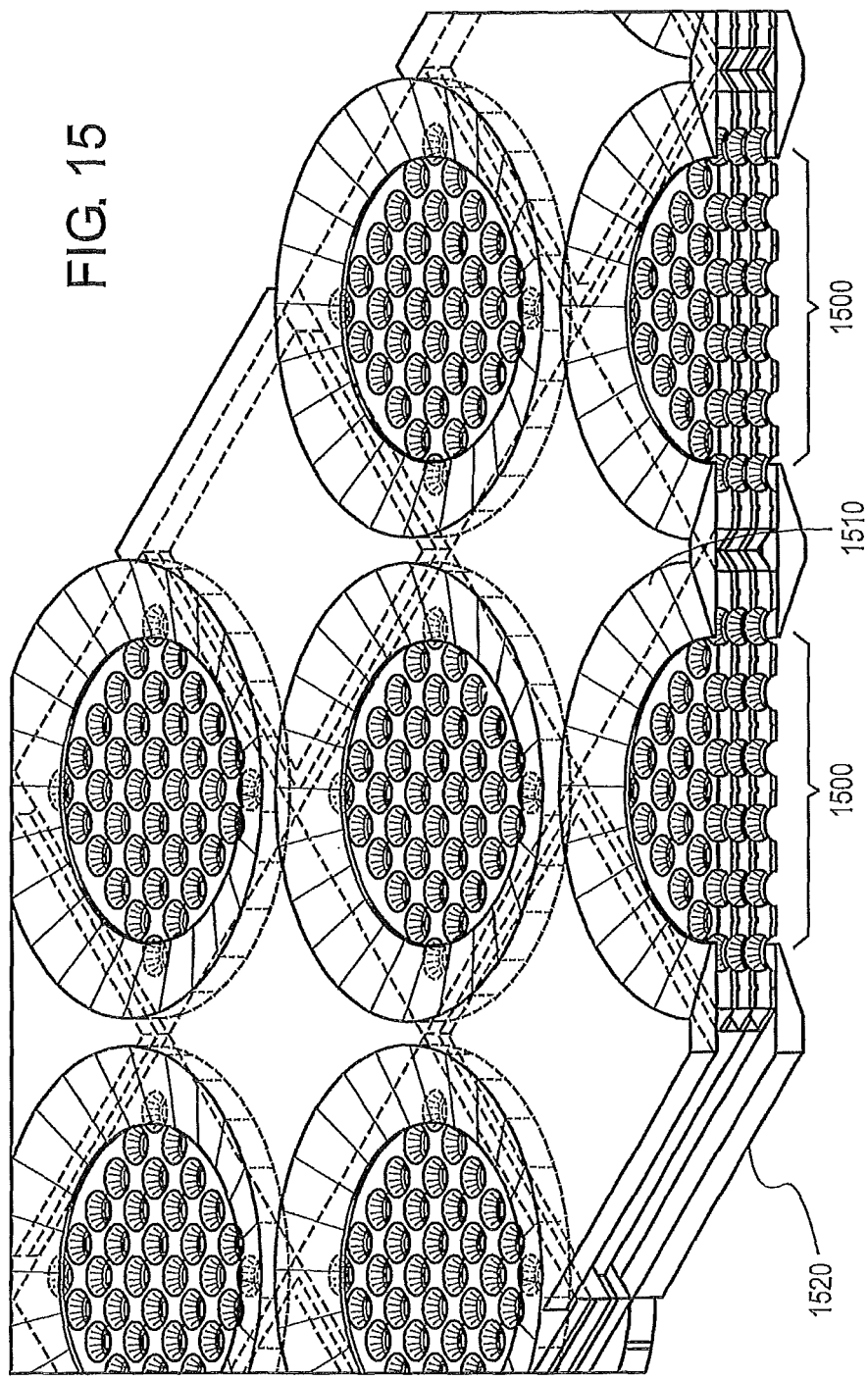
FIG. 15 shows a perspective view of an NMSet with an external Peltier arrangement.

A cross section of an NMSet or related device according to an embodiment with an internal Peltier arrangement is detailed in FIGS. 13 and 14. All hot layers 1302 are connected. All cold layers 1301 are connected. An electric current flows through a Peltier device interposed between the cold and hot layers to establish a temperature differential. The thinner the layers are, the higher the electric current is necessary.

An NMSet or related device with the internal Peltier arrangement can make it easier to reduce the size of the device. A single stack such as the one shown in FIG. 14 can be fully functional to generate thrust. An NMSet or related device with the internal Peltier arrangement suitable for use in microelectromechanical systems that emphasize the highest degree of granularity.

Field-Enhanced Thermionic Emission

In another embodiment, the temperature differential can be generated by field-enhanced thermionic emission. As shown in FIG. 19, an electrical field can be established between the layers 1901 and 1902 such that charge carriers thermally emitted from the cold layer 1901 carry heat from the cold layer 1901 to the hot layer 1902.

External Peltier

In another embodiment, the temperature differential can be generated by a Peltier device external to an NMSet or related device. This Peltier device (not shown) is thermally coupled to an NMSet or related device stack 1500 via interface layers 1510 and 1520 as detailed in FIGS. 15 and 16.

A device with an external Peltier device has the benefit of separating the materials used to generate fluid flow from the materials used to generate the temperature differential. From an engineering standpoint this may be desirable, as the materials suitable for a Peltier device may not be suitable for microstructures, or vice versa. In addition, an external Peltier device can be made larger and more efficient, and do not require high current to establish sufficient temperature differential.

Piezoelectric spacers can be used between layers. Materials suitable for use in an NMSet preferably are strong enough to mechanically withstand thermal expansion and contraction, and/or preferably have very small expansion coefficients. Otherwise, holes in the layers could become misaligned, which could reduce efficiency.

External Non-Peltier

According to yet another embodiment, a temperature differential is established by any suitable heat source and/or heat sinks. For example, the heat sources might be resistive heaters, chemical reaction, combustion, and/or direct illumination of bright light. An illustration of such an embodiment is shown in FIG. 17. In the example shown, a heating surface 1702 can be resistive heating material, or a material that can efficiently receive radiative heating. The external non-Peltier arrangement is convenient because it does not require a Peltier device. For some applications, it may be convenient to direct the heating surface towards a source of radiation, such as the sun, rather than first converting radiation into electricity and drive a Peltier device. Alternatively, a source of radiation may be directed toward a heat absorbing surface in thermal communication with the hot layer of an NMSet or related device. In an external non-Peltier arrangement, however, care is preferably taken to ensure that the NMSet or related device does not overheat.

The capillaries 1750 illustrated in FIG. 17 provide an exemplary mechanism by which a heat sink could be provided; however, it is also possible for the heat sink to simply be a series of vanes, or any other suitable heat sinks. Alternatively, the external non-Peltier arrangement in FIG. 17 could be configured to provide a heat source through the capillaries 1750. The heat source can be an exothermic chemical reaction, preferably one that does not generate too much pressure.

Materials

NMSet and related devices may be constructed of a wide range of materials. In various aspects, properties of materials may be exploited in combination with desirable geometries.

Specular reflection of gas molecules is a preferred property of the materials which form the gas-exposed surfaces of an NMSet or related device, e.g. the heated and cooled surfaces which are in contact with flowing gas. Specular reflection is the mirror-like reflection of light, or in this case gas particles, from a surface. On a specular surface, incoming gas particles at a single incident angle are reflected from the surface into a single outgoing angle. If the incoming gas particles and the surface have the same temperature, the incident angle and the outgoing angle with respect to the surface normal are the same. That is, the angle of incidence equals the angle of reflection. A second defining characteristic of specular reflection is that incident, normal, and reflected directions are coplanar. If the incoming gas particles and the surface are not at the same temperature and the reflection is diabatic (i.e. with heat exchange between the gas particles and the surface), the angle of reflection is a function of heat transferred between the surface and the gas particles.

The degree of specularity of a material may be represented by a reflection kernel (such as the Cercignani-Lampis kernel) which is defined as the probability density function of reflected state of the gas particles per unit volume of the phase space. Details of the reflection kernel are disclosed in "Numerical Analysis of Gas-Surface Scattering Effect on Thermal Transpiration in the Free Molecular Regime", *Vacuum*, Vol. 82, Page 20-29, 2009, and references cited therein, all of which are hereby incorporated by reference.

Individual hot and cold layers may also be constructed of one or more structural elements which can comprise structural materials, e.g. a means for conferring rigidity, thermal conductive material, e.g. a means for heat transfer to and from a temperature differential generating means, and atomic reflection material, e.g. means for providing a desirable reflection kernel properties. In some embodiment, individual hot and cold layers may be constructed of layered composites of such materials.

Thus, the choice of materials is and composition is widely variable. In some embodiments, materials suitable for construction of an NMSet or related device can include titanium, silicon, steel, and/or iron. Titanium is light weight and possesses a hexagonal crystalline structure. Interfaces of titanium may be created at orthogonal angles without crystalline warping and therefore no stress limit. Material costs of titanium are high. Silicon is inexpensive and has well understood properties and processes for machining. The crystalline structure of silicon is diamond cubic. Steel is cheaper than titanium, possesses a cubic crystalline structure, and is highly resistant to gaseous intrusion. Iron is cheaper than steel and has a crystalline form which makes it suitable for application in NMSet and related devices.

Exemplary Methods of Manufacturing an NMSet or Related Device

Figure 20:
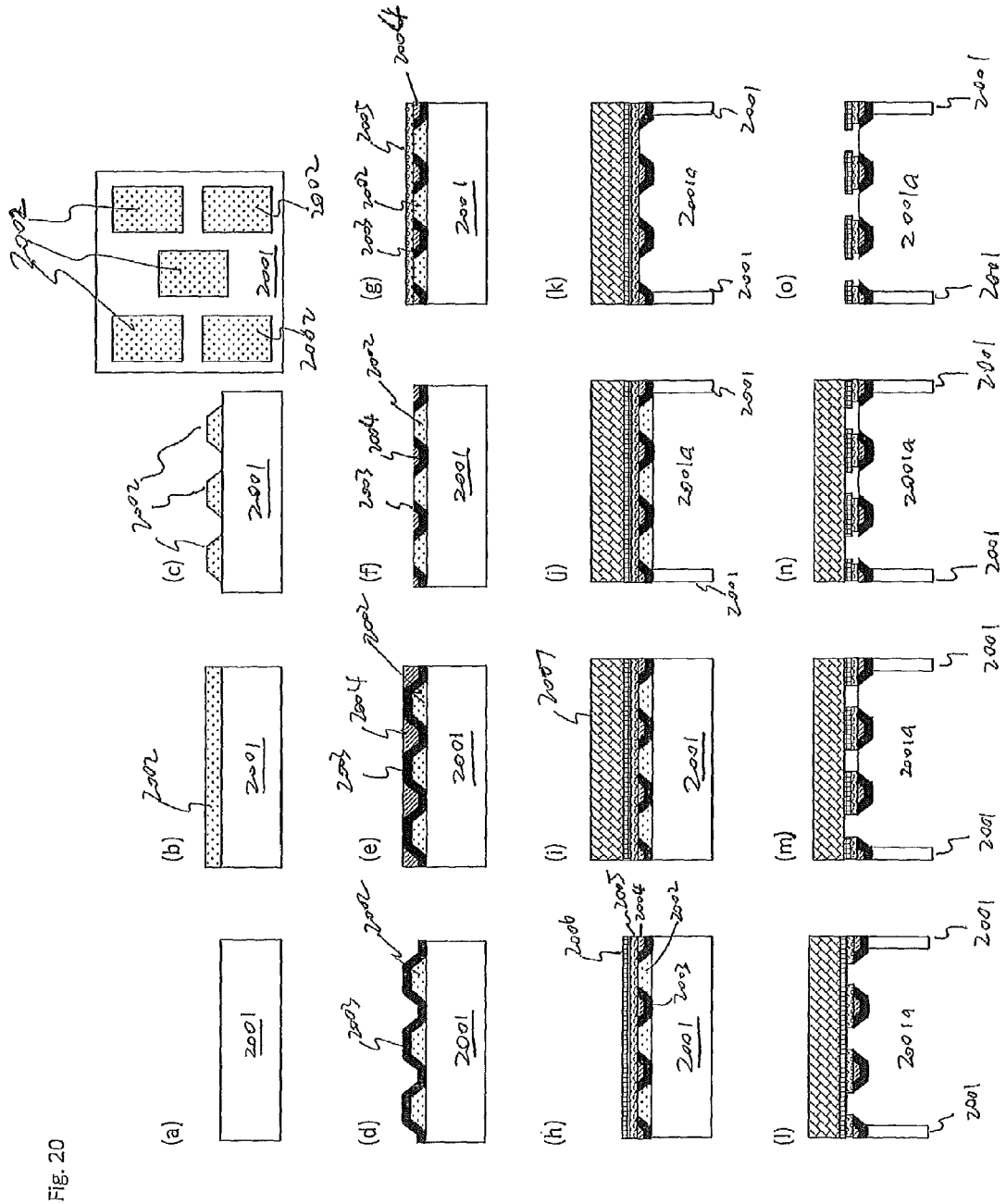
FIG. 20 shows an exemplary method of manufacturing an NMSet.

According to one embodiment as shown in FIG. 20, a method of manufacturing an NMSet or related device comprises: (a) providing a suitable substrate 2001 such as amorphous silicon, crystalline silicon, ceramic, etc., the substrate preferably having a thickness of 500 to 1500 microns; (b) depositing a first layer 2002, such as silicon dioxide, the first layer 2002 preferably having a thickness of 200 nm to 50 microns; (c) forming discrete islands in any suitable shape such as strip, square, circle from the first layer 2002 by photolithography and etching the first layer 2002; (d) depositing a second layer 2003 over the discrete islands, the second layer 2003 being an electrical conductor such as Al, Nb or Zn; (e) depositing a third layer 2004 over the second layer 2003, the third layer 2004 being an electrical insulator such as silicon dioxide; (f) partially removing the third layer 2004 until the first layer 2002 is exposed; (g) depositing a fourth layer 2005, the fourth layer 2005 being an electrical insulator such as silicon dioxide, the fourth layer 2005 preferably having a thickness of 3 to 15 nm; (h) depositing a fifth layer 2006, the fifth layer being an electrical conductor such as Pt, Ni or Cu, and preferably having a thickness of 50 to 200 nm; (i) depositing a sixth layer 2007 such as silicon dioxide, the sixth layer 2007 preferably having a thickness of 500 to 1500 microns; (j) forming through holes 2001a in the substrate 2001 by photolithography and etching the substrate 2001, such that at least one discrete island of the first layer 2002 is exposed therein, the through holes 2001a having any suitable shape such as hexagons, squares and circles, the through holes 2001 being arranged in any suitable pattern such as a hexagonal grid, square grid and a polar grid; (k) removing exposed discrete islands by etching until portions of the fourth layer 2005 thereabove are exposed; (l) removing exposed portion of the fourth layer 2005 by etching until portions of the fifth layer 2006 thereabove are exposed; (m) removing exposed portions of the fifth layer 2006 by etching; (n) partially removing the fourth layer 2005 by etching laterally such that the second layer 2003 and the fifth layer 2006 overhang the fourth layer 2005; (o) completely removing the sixth layer 2007 by etching. The second layer 2003 and the fifth layer 2006 preferably have a difference of at least 0.1 eV, at least 2 eV or at least 3 eV in their work-functions.

Figure 21:
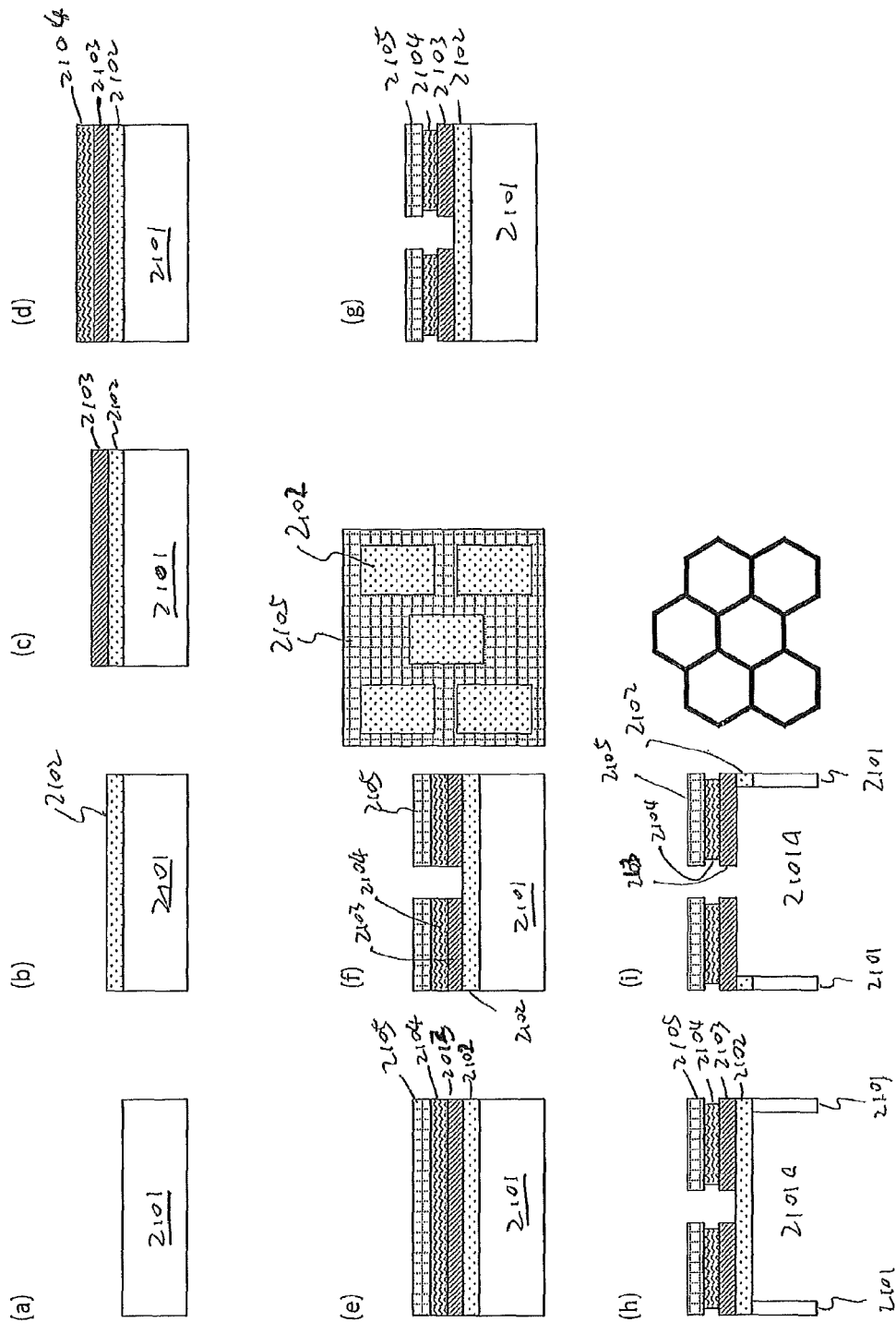
FIG. 21 shows another exemplary method of manufacturing an NMSet.

According to another embodiment as shown in FIG. 21, a method of manufacturing an NMSet or related device comprises: (a) providing a suitable substrate 2101 such as amorphous silicon, crystalline silicon, ceramic, etc., the substrate preferably having a thickness of 500 to 1500 microns; (b) depositing a first layer 2102, such as silicon dioxide, the first layer 2102 preferably having a thickness of 50 nm to 1000 nm; (c) depositing a second layer 2103 over the first layer 2102, the second layer 2103 being an electrical conductor such as Al, Nb or Zn and preferably having a thickness of 50 to 150 nm; (d) depositing a third layer 2104 over the second layer 2103, the third layer 2104 being an electrical insulator such as silicon dioxide and preferably having a thickness of 50 to 100 nm; (e) depositing a fourth layer 2105 over the third layer 2104, the fourth layer 2105 being an electrical conductor such as Pt, Ni or Cu and preferably having a thickness of 50-150 nm; (f) forming holes through the second layer 2103, the third layer 2104 and the fourth layer 2105 by photolithography and etching, the holes having any suitable shape such as strips, squares, circles; (g) partially removing the third layer 2104 by etching laterally such that the second layer 2103 and the fourth layer 2105 overhang the third layer 2104; (h) forming through holes 2101a in the substrate 2101 by photolithography and etching the substrate 2101, such that at least one hole through the second layer 2103, the third layer 2104 and the fourth layer 2105 overlaps with one through hole 2101a, the through holes 2101a having any suitable shape such as hexagons, squares and circles, the through holes 2101 being arranged in any suitable pattern such as a hexagonal grid, square grid and a polar grid; (i) removing portions of the first layer 2102 exposed in the through holes 2101a. The second layer 2103 and the fourth layer 2105 preferably have a difference of at least 0.1 eV, at least 2 eV or at least 3 eV in their work-functions.

Exemplary Thermal Transpiration Devices with Vacuum Layer

Figure 22:
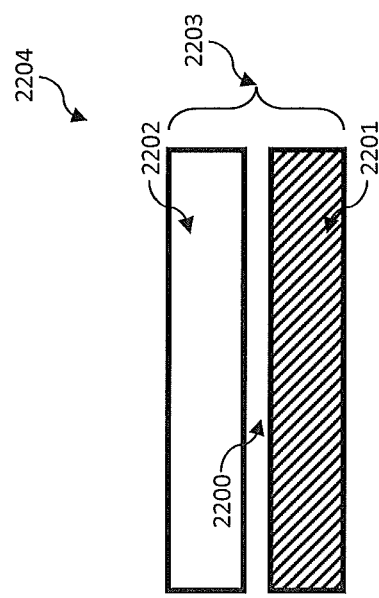
FIG. 22 is a side cross-sectional view illustrating a thermal transpiration device.

Though somewhat redundant, FIG. 22 is a side cross-sectional view illustrating a thermal transpiration device, such as an NMSet or related device, shown generally at 2204. The thermal transpiration device includes a cold side membrane 2202 and a hot side membrane 2201, with a thermal insulator 2200 provided in between. The thermal insulator 2200 may be formed of a vacuum, which can be achieved, for example, via the Venturi effect. The thermal transpiration device 2204 includes a thickness 2203 defined by the cold side membrane 2202, the thermal insulator 2200 and the hot side membrane 2201.

Figure 23:
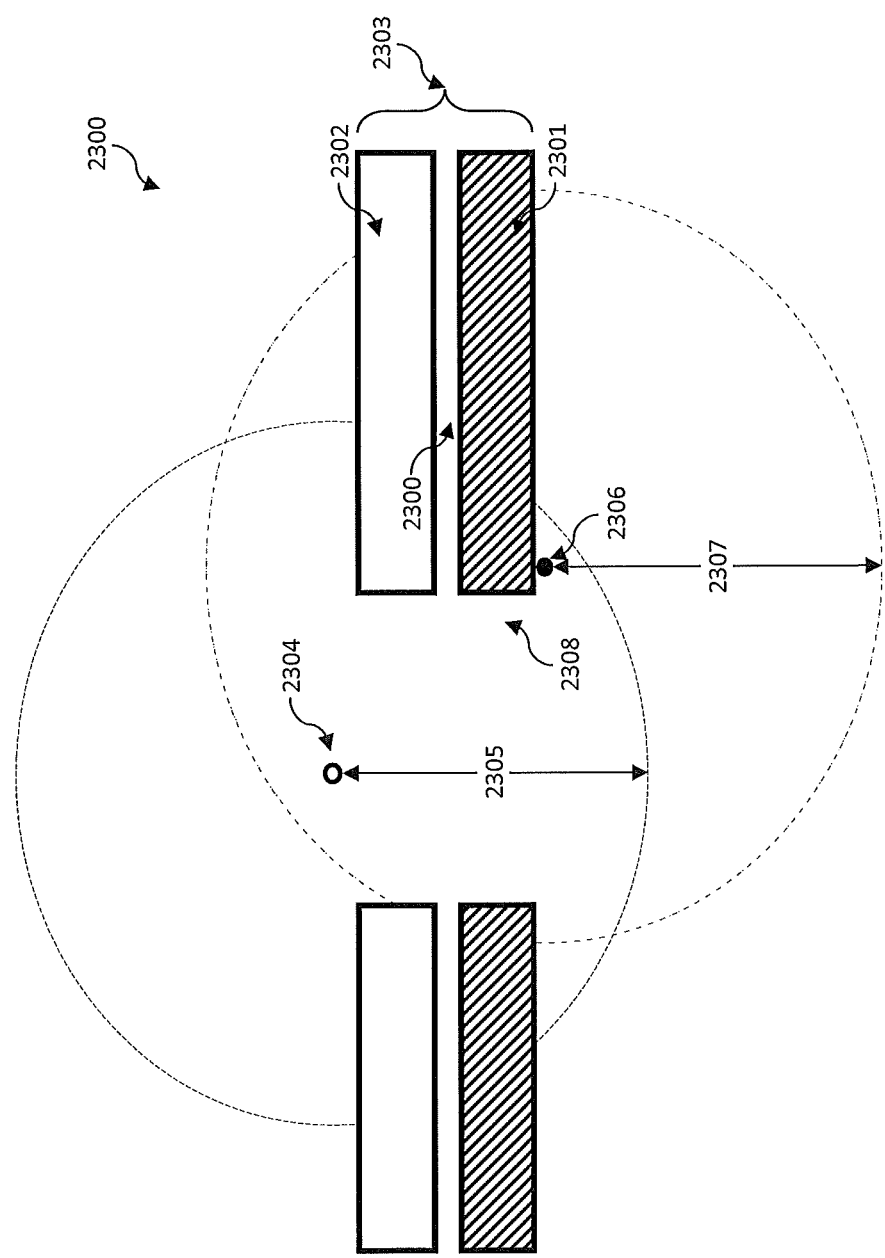
FIG. 23 is a side cross-sectional view illustrating the operation of a thermal transpiration device.

FIG. 23 is a side cross-sectional view illustrating the operation of a thermal transpiration device, shown generally at 2309. The device 2309 includes a hotter layer 2301, a colder layer 2302, with a thermal insulator 2300 provided there between. Apertures 2308 are formed in the device 2309 in a manner as previously described. The thermal transpiration device 2309 includes a thickness 2303 defined by the colder layer 2302, the thermal insulator 2300 and the hotter layer 2301. The thermal insulator 200 can be formed of a vacuum, which can be achieved, for example, via the Venturi effect.

Colder gas particles 2304, which have a mean free path (average distance traveled before hitting another particle) shown by arrow 2305, enter the aperture 2308, or the edge thereof, and collide with other particles, thus exchanging energy. Hotter gas particles 2306, which have a mean free path shown by arrow 2307, collide into the hotter layer 2301, thus gaining energy in the process and imparting a positive momentum force. The colder gas particles 2304 lower the temperature of the hotter gas particles 2306, which collide back into the hotter layer 2301, thus gaining energy and imparting a positive momentum force and increased pressure on the hot layer 2301.

Figure 24:
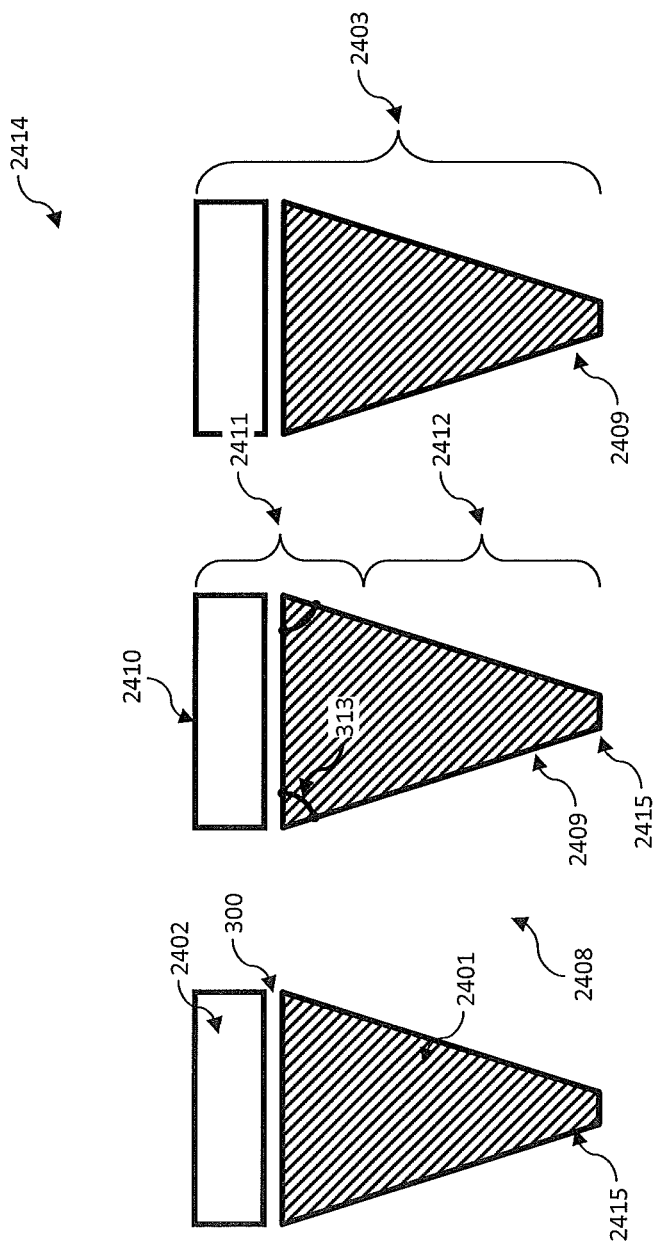
FIG. 24 is a side cross-sectional view of a thermal transpiration device with one extended layer and angled walls.
Figure 25:
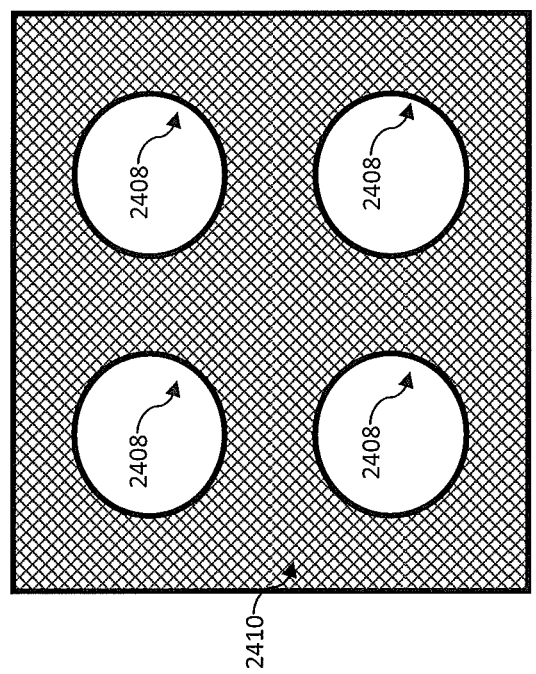
FIG. 25 is a top cross-sectional view of the thermal transpiration device illustrated in FIG. 24.

FIGS. 24 and 25 are respective side and top cross-sectional views of a thermal transpiration device, shown generally at 2414, with one extended layer having angled walls. The device 2414 includes a hotter layer 2401 and a colder layer 2402, with a thermal insulator 2400 provided there between. The thermal insulator 2400 can be formed as a vacuum, which can be achieved, for example, via the Venturi effect. The total thickness of the device 2414 is indicated by reference number 2403, and is defined by the colder layer 2402, the thermal insulator 2400 and the hotter layer 2401.

Apertures 2408 are provided in the device 2414, forming angled walls 2415 in the hotter layer 2401, in a manner as previously described. The apertures 2408, and/or edges thereof, aid in defining a hotter surface 2409, a colder surface 2410, an active area 2411 generally where thermal transpiration occurs, and a support area 2412. As shown in FIG. 24, the angle 2413 of the hotter surface 2409 is less than 90-degrees in order to form the angled walls 2415.

While FIGS. 24 and 25 illustrate the extended layer having angled walls as being the hotter layer 2401, one skilled in the art will appreciate that the colder layer 2402 could be implemented as the extended layer having angled walls as an acceptable alternative.

Figure 26:
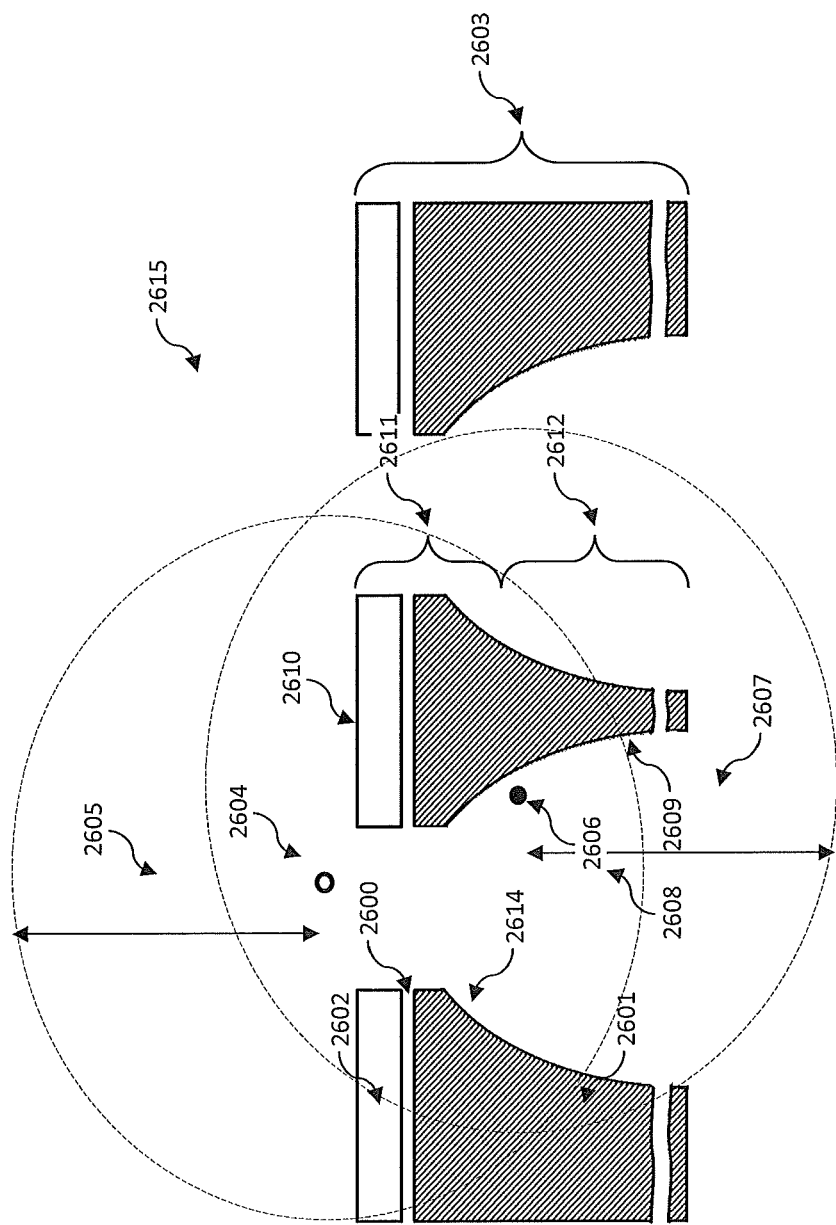
FIG. 26 is a side cross-sectional view of a thermal transpiration device with one extended layer and wet etched walls.
Figure 27:
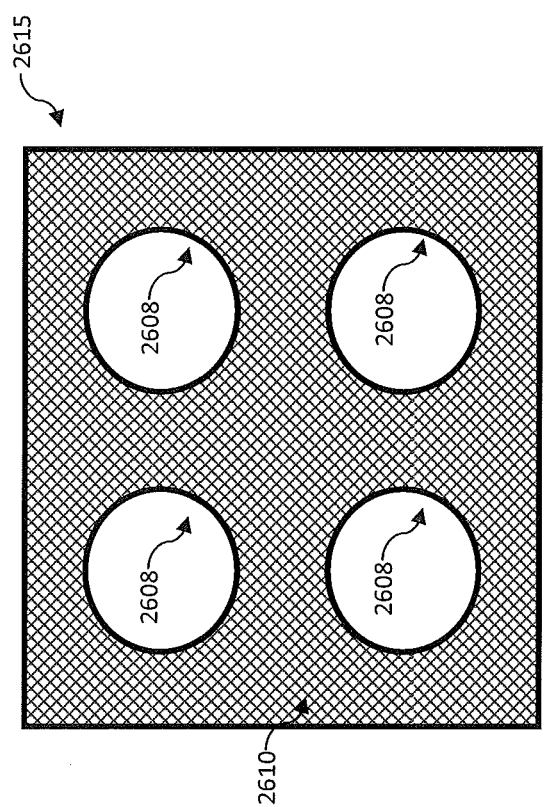
FIG. 27 is a top cross-sectional view of the thermal transpiration device illustrated in FIG. 26.

FIGS. 26 and 27 are respective side and top cross-sectional views of a thermal transpiration device, shown generally at 2615, with one extended layer having wet-etched walls. The device 2615 includes a hotter layer 2601, a colder layer 2602, with a thermal insulator 2600 provided there between. The thermal insulator 2600 can be formed as a vacuum, which can be achieved, for example, via the Venturi effect. The total thickness of the device 2615 is indicated by reference number 2603, and is defined by the colder layer 2602, the thermal insulator 2600 and the hotter layer 2601.

Apertures 2608 are provided in the device 2615, and forming wet-etched walls 2614 in the hotter layer 2601 having a generally parabolic shape, in a manner as previously described. The apertures 2608, and/or edges thereof, aid in defining a hotter surface 2609, a colder surface 2610, an active area 2611 generally where thermal transpiration occurs, a support area 2612 and wet-etched surfaces 2614.

Reference number 2605 indicates the mean free path of colder gas particles 2604. Reference number 2607 indicates the mean free path (the average distance traveled before hitting other particles) of hotter gas particles 2606. The colder gas particles 2604, enter the aperture 2608, or the edge thereof, and collide with other particles, thus exchanging energy. The hotter gas particles 2606 collide into the hotter layer 2601 at the outer edge thereof or at the wet-etched surface 2614, thus gaining energy in the process and imparting a positive momentum force. The colder gas particles 2604 lower the temperature of the hotter gas particles 2606, which collide back into the hotter layer 2601 thus gaining energy and imparting a positive momentum force and increased pressure on the hot layer 2601.

While FIGS. 26 and 27 illustrate the extended layer having wet-etched walls as being the hotter layer 2601, one skilled in the art will appreciate that the colder layer 2602 could be implemented as the extended layer having angled walls as an acceptable alternative.

Figure 28:
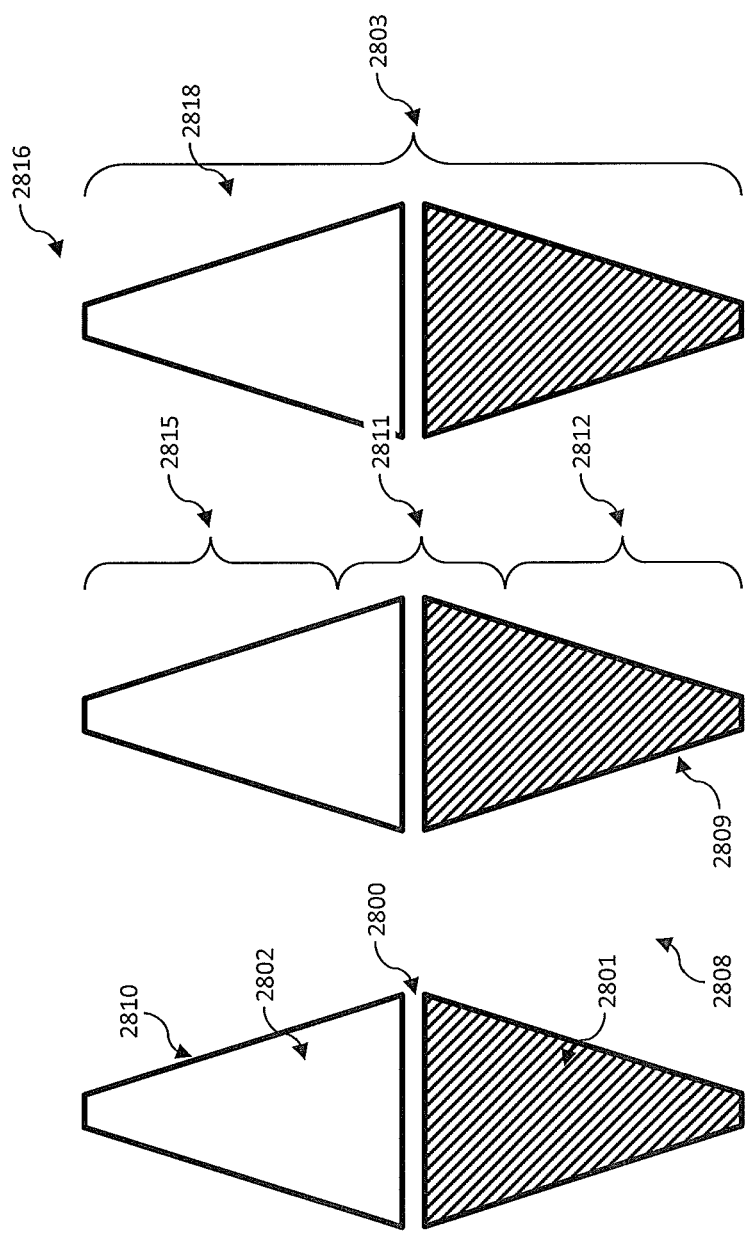
FIG. 28 is a side cross-sectional view of a thermal transpiration device with two extended layers and angled walls.

FIG. 28 is a side cross-sectional view of a thermal transpiration device, shown generally at 2816, with two extended layers having angled walls. The device 2816 includes a hotter layer 2801 and a colder layer 2802, with a thermal insulator 2800 provided there between. The thermal insulator 2800 can be formed as a vacuum, which can be achieved, for example, via the Venturi effect. The device 2816 has a total thickness 2803, defined by the colder layer 2802, the thermal insulator 2800 and the hotter layer 2801.

Apertures 2808 are provided in the device 2816, forming angled walls 2817 and 2818 in the hotter 2801 and colder 2802 layers, respectively, in a manner as previously described. The apertures 2808, and/or edges thereof, aid in defining a hotter surface 2809, a colder surface 2810, an active area 2811 generally where thermal transpiration occurs, a support area 2812 for the hotter layer 2801, and a support area 2815 for the colder layer 2802. As shown in FIG. 28, the angle 2819 of both the hotter 2809 and colder 2810 surfaces are less than 90-degrees in order to form the angled walls 2817 and 2818, respectively. While the angles 2819 of the hotter 2809 and colder 2810 are shown in FIG. 28 as being approximately the same angle, the hotter 2809 and colder 2810 surfaces may be angled at different angles as an acceptable alternative depending on the embodiment.

In an ideal thermal transpiration device, the total thickness of the device should be less than 500 nm. For optimization purposes, the thickness between the hot and cold surfaces should be no greater than 100 nm. Such small thicknesses make the device extremely fragile and difficult to work with. If, for example, the device layers, or membranes, are made thicker in order to provide the required thickness for the stability and strength of the device, its overall thickness would increase to a point that it exceeds the ideal thickness, as discussed above.

Figure 29:
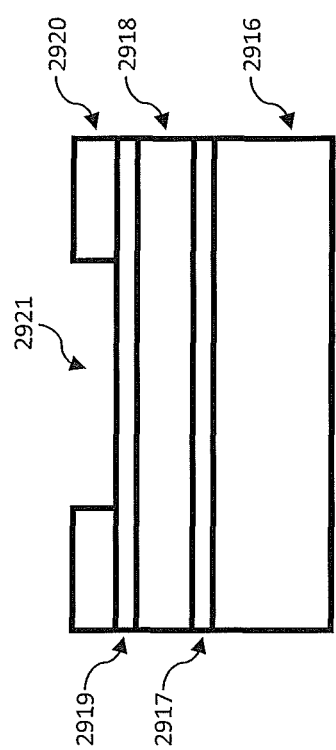
FIG. 29 is a cross-sectional view of a beginning construction of one embodiment of a thermal transpiration device.

FIG. 29 is a cross-sectional view of the beginning construction of one embodiment of a transpiration device, shown generally at in accordance with the present disclosure, which allows the thickness of a transpiration device to be made thicker to enhance it durability and strength, while at the same time maintaining the thickness of the device in its critical area to within an ideal thickness range.

As shown in FIG. 29, the construction of the device is as follows. First, a silicon substrate layer 2916 is provided. A first metal layer 2917 of, for example, approximately 40 nm of aluminum, is deposited on the substrate 2916. The deposition process may be evaporation, but other deposition methods may be used, such as, for example, sputtering, metal organic vapor deposition, etc. Hence, the first metal layer 2917 may be 40 nm of evaporated aluminum.

A dielectric layer 2918 is deposited on top of the first metal layer 2917. The dielectric layer 2918 must be low stress and may be formed of a plastic or inorganic non-electrically conducting film material. The film (i.e., dielectric layer 2918) may be, in particular, low-stress plasma enhanced chemical vapor deposition oxynitride that is 2 microns thick. Other thicknesses are also contemplated.

An adhesion promoter layer 2919 may be deposited on dielectric layer 2918 to promote adhesion to the dielectric. Such material may be a chemical monolayer, such as HMDS, a thin film of organic resist, or a metal, in particular, 6 nm of chromium. The adhesion promoter layer 2919 may not be necessary on certain combinations of thin films and etching methods or etching chemicals.

The device is then etched, as is conventionally known, using a mask 2920 of approximately 1.3 microns SPR-3012, for example, with an unmasked area 2921. Etching may be achieved by depositing the photoresist layer, or mask, 2920 over the adhesion promoter layer 2919, as is known to do by one of ordinary skill in the art. Such a photoresist is preferably Shipley SPR-3012, however, other photoresists may be utilized. The photoresist layer 2920 may then be exposed through a conventional mask to develop unmasked areas 2921. Exposure can be made, for example, using an appropriate wavelength of light. Contact lithography may also be used as would be understood by one of ordinary skill in the art. Once exposed, the photoresist layer 2920 may be developed in a solution appropriate for that purpose to form the unmasked areas 2921. Such a solution may be, for example, 0.26M tetramethylamonium hydroxide for SPR-3012 for approximately 60 seconds.

Figure 30:
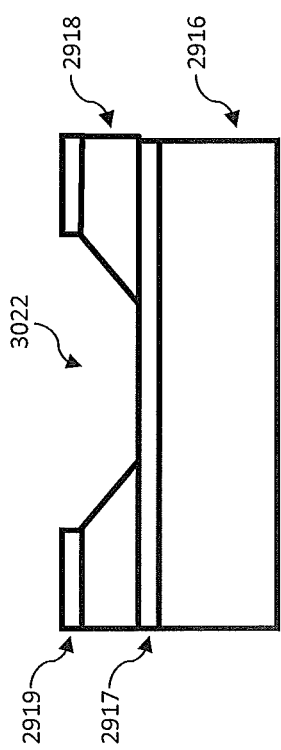
FIG. 30 is a cross-sectional view of the continued construction of the thermal transpiration device shown in FIG. 29.

As shown in FIG. 30, the device is etched at the unmasked areas 2921 to form etched areas 3022. The etched areas 3022 are formed by etching into the adhesion promoter layer 2919 and the dielectric layer 2918 until portions of the first metal layer 2917 are exposed. The photoresist layer 2920 is then removed. The adhesion promoter layer 2919 may be etched using a wet etch, such as, for example, a chromium etch 1020 from Transene. The dielectric layer 2918 may be etched, for example, with a chemical that will not etch the first metal layer 2917. In the case of oxynitride on aluminum, the aqueous acid solution Silox Vapox II from Transene can be used. Other wet chemistries may also be used, or a dry plasma etch.

Figure 31:
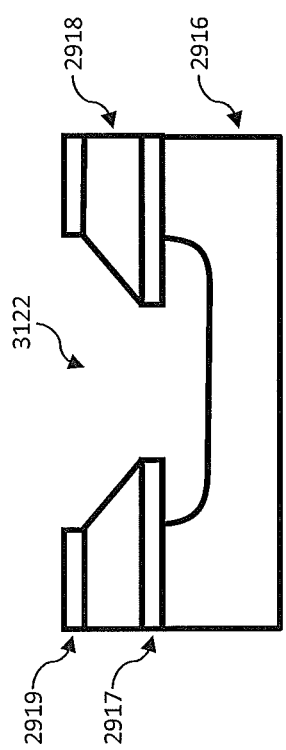
FIG. 31 is a side cross-sectional view of the continued construction of the thermal transpiration device shown in FIG. 30.

FIG. 31 is a side cross-sectional view showing further etching of the thermal transpiration device shown in FIGS. 29-30. Reference number 2916 is the silicon substrate, reference number 2917 is the first metal layer, reference number 2918 is the dielectric layer, and reference number 2919 is the adhesive promoter layer. In FIG. 31, the device, namely, the etched area 3022, has been further etched to provide an etched area 3122 and under cut area 3123. To form the etched area 3122, the first metal later 2917 is etched, and then portions of the substrate 2916 are etched. To form the undercut areas 3123, portions of the substrate 2916 which are underneath the first metal layer 2917 are laterally etched.

The first metal layer 2917 may be etched with either wet or dry etching. In the case of aluminum, for example, an aluminum etch in a reactive ion etcher with chlorine and argon at low pressure may be used to etch the first metal layer 2917. An example of an etch for 40 nm of aluminum is 50 sccm BCl3, 20 sccm Cl2, 10 mTorr, with 300 W RF power.

A wet or vapor etch can be used to etch the substrate 2916, as long as the chemistry does not etch the first metal layer 2917 or the dielectric layer 2918. In the case of a silicon substrate with aluminum and oxynitride, the silicon may be etched, for example, with the gas XeF2. The substrate 2916 may also be treated to remove boron. One exemplary method of such a treatment is to use a fluorine based reactive ion plasma under the conditions of 35 sccm CF4, 20 mTorr, and 300 W RF power.

Figure 32:
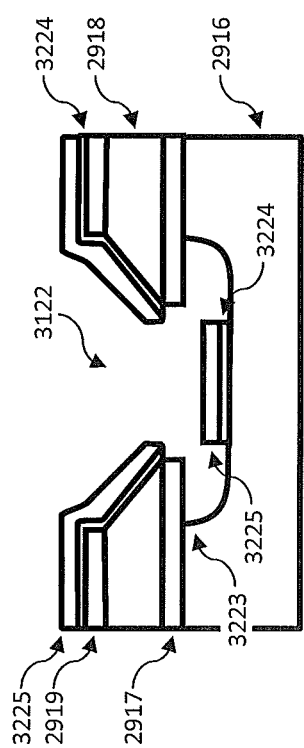
FIG. 32 is a cross-sectional view showing further construction of the thermal transpiration device shown in FIG. 31.

FIG. 32 is a cross-sectional view showing further formation and etching of the thermal transpiration device shown in FIGS. 29-31. A thin layer 3224 of silicon dioxide is provided over the device. The silicon dioxide layer 3224 can be, for example, approximately 5-10 nm thick. The layer 3224 of silicon dioxide is provided to control tunneling thickness. The layer 3224 can be added by evaporation, or other known techniques. For example, other methods, such as sputtering, plasma enhanced chemical vapor deposition, atomic layer deposition, etc., may be used as well, along with other materials. A second metal layer 3225 is provided over the silicon dioxide layer 3224. The second metal layer 3225 may be a layer of metal, such as nickel or copper, and may be approximately 40 nm thick. The second metal layer 3225 may be formed by evaporation, but other methods may be used as well, such as, for example, sputtering or ion assisted deposition.

The substrate 2916 is then mounted to a carrier substrate (not shown) with the thin film stack facing the carrier. The mount material could be, for example, a double-sided tape, such as Revalpha thermal release tape. However, other tapes and materials, such as, for example, wax or photoresist, may be used as well.

Figure 33:
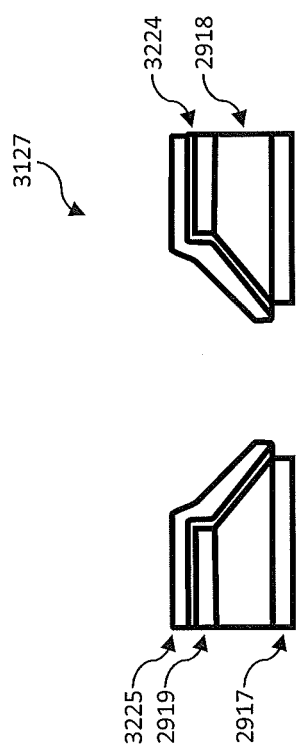
FIG. 33 is a cross-sectional view showing the islands formed in the construction of the thermal transpiration device.

The remaining silicon substrate 2916 is then removed with, for example, an XeF2 vapor etch. The small portions of the silicon dioxide layer 3224 and the second metal layer 3225 formed in the etched portion of the substrate 2916 are removed with the substrate 2916. Wet chemistry may also be used to remove the substrate 2916, as long as it does not etch the first and second metal layers 2917 and 3225. What is left, as shown in FIG. 33, are the islands 3327 formed by the first metal layer 2917, the dielectric layer 2918, the adhesion promoter layer 2919, the silicon dioxide layer 3224, and the second metal layer 3225. The device is then sonicated to remove any Nicole plugs. In the case of Revalpha thermal release tape, for example, the carrier substrate can be placed on a hotplate of sufficient temperature to aid in removing the device.

Fault Tolerant Control System for Distributed Micro-Thrusters

In order to drive an object using a micro thruster in a particular direction a control system is needed. The control system is used to selectively activate a micro thruster or plurality of micro thrusters to provide a force in the desired direction.

In accordance with the present control system, a control system for controlling the operation of a plurality of micro thrusters may be constructed as a grid of elements (each containing one or more micro thruster elements) fed by a redundant two dimensional network of power distribution wiring. The distribution network is constructed as a plurality of loops comprised of horizontal and vertical lines or wires that are coupled to a plurality of horizontal rows and vertical columns of micro thrusters.

According to one embodiment of the present control system, each row and column loop meet or intersect in at least four locations, but alternating topologies may be designed to balance redundancy, number of loops, and the granularity of addressing. Alternate topologies may have a different number of crossings.

At least one power source may be supplied for each element in the grid or for a plurality of elements. One element may contain a plurality of micro thrusters. One terminal of the power source is connected to a horizontal line, and the other terminal of the power source is connected to a vertical line. This connection permits an element or group of elements to be selected by connecting the terminals of a power source to a appropriate row and column.

In accordance with the general operation of the micro thrusters, an electrical circuit is used to activate a micro thruster by supplying heat or cold to the micro thruster. An electrical circuit is formed by a loop comprised of the horizontal and vertical lines. Both ends of a given loop are driven at the same electrical potential. This means that a single cut anywhere in a given loop (as a result, for example, from damage to the array surface) will not cause a loss of functionality. The heating or cooling caused by electrical circuit may be implemented by way of the Peltier effect using a Peltier slab. In this instance, the wiring are on either side of the micro thrusters, and in a resistance embodiment explained below, they may be only on the hot side.

Figure 34:
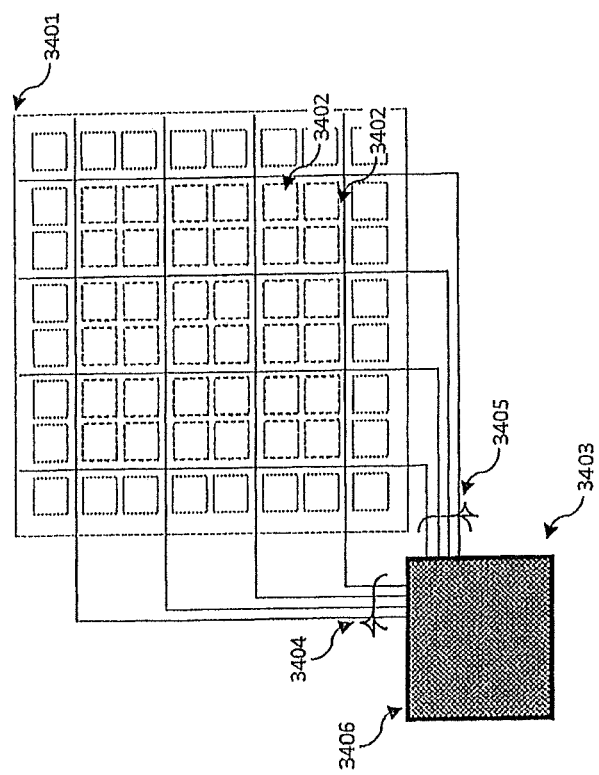
FIG. 34 is a top view of an embodiment of a control system in accordance with the present disclosure.

FIG. 34 is a top view of one embodiment of a control system 3400 for an array 3401 of micro thrusters 3402 in accordance with the control system. As can be seen in FIG. 34, in the array 3401, a plurality of micro thrusters 3402 are arranged in a grid-like manner in parallel horizontal rows and parallel vertical columns.

At least one power supply 3406 provides power to selected micro thrusters 3402 using a first plurality of power lines 3404 and a second plurality of powers lines 3405 which are coupled to the micro thrusters in each of the horizontal rows and in each of the vertical columns, respectively. When one of the power lines 3404 is selected along with one of the power lines 3405, an electrical circuit is completed and at least one of the micro thrusters is activated by the heat generated by the electrical circuit. A control unit 3403 controls the activation of the selected power lines 3404 and 3405 for a desired micro thruster or group of micro thrusters.

As used in the present control system, the power supply 3406 may be a battery and the control unit 3403 may be a central processing unit. Further, micro thrusters 3402 may comprise a plurality of NMSet devices.

An NMSet device may comprise an apparatus operable to propel a gas where the apparatus comprises at least a first layer and a second layer arranged in a stack and means for heating and/or cooling the first and second layers to form a hot layer and a cold layer wherein the cold layer has a lower temperature than the hot layer, and at least one through hole in the stack. A surface of each hot layer is exposed in an interior of the through hole, a surface of each cold layer is exposed in the interior of the through hole, and an entire length of the through hole is up to 10 times of a mean free path of a gas in which the apparatus is immersed and/or is not greater than 1500 nm, as explained above.

In a given NMSet device the at least one through hole may have a straight geometry, a sawtooth geometry, a triangular geometry, a parabolic geometry, or any geometry that may be determined to be beneficial for the NMSet device, as explained above.

Figure 35:
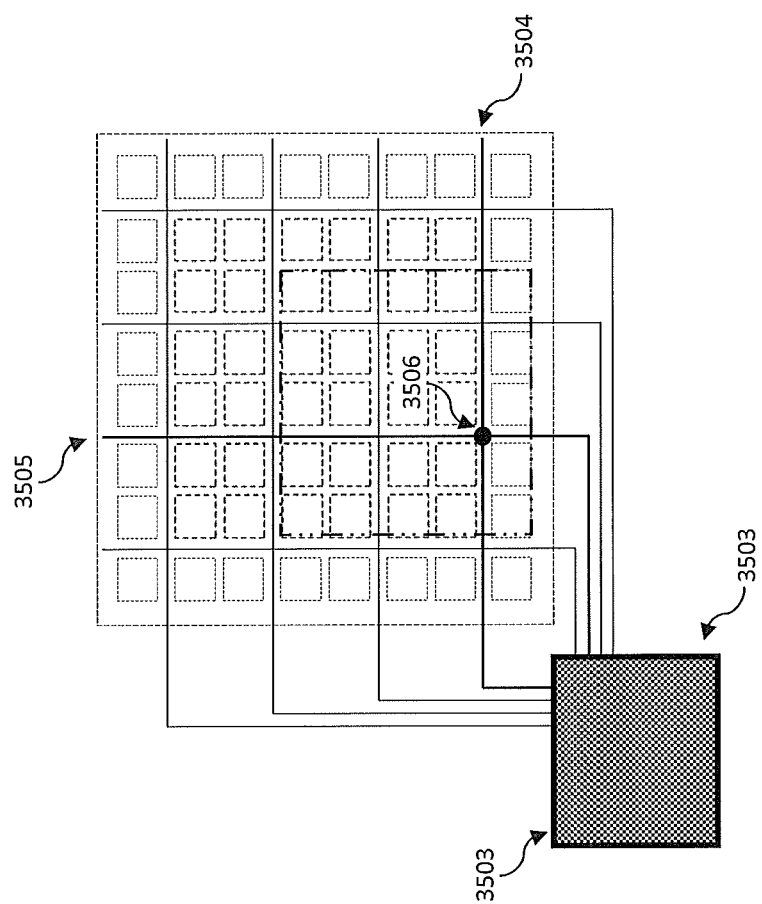
FIG. 35 is a top view of the control system illustrated in FIG. 1 showing an example of power supply and connection paths.

FIG. 35 illustrates power lines 3504 and 3505 that meet at area 3506 to activate the micro thruster's adjacent area 3506. The control unit 3503 activates the micro thruster's adjacent area 3506 by causing the power supply 3406 to provide electricity to power lines 3504 and 3505.

Figure 36:
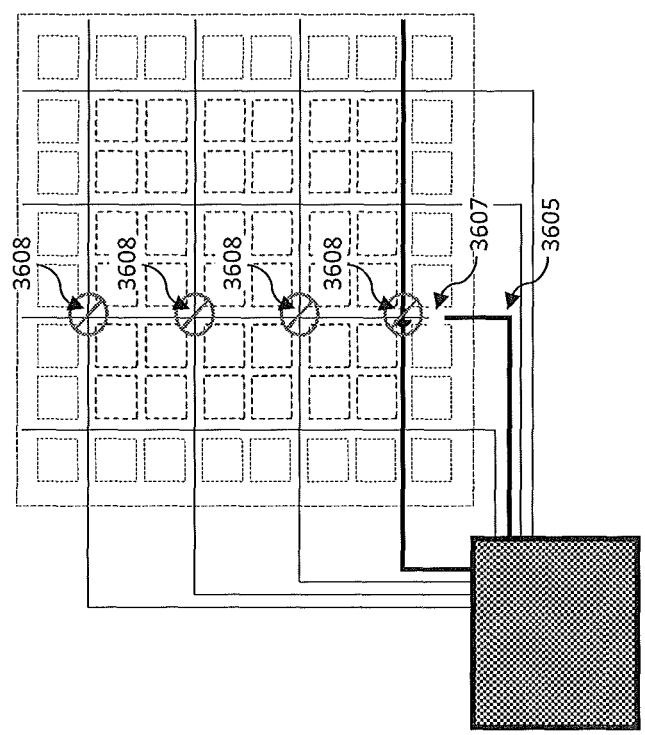
FIG. 36 is a top view of the control system illustrated in FIG. 1 showing the effects of a fault in one of the power lines.

FIG. 36 illustrates a fault condition where there is an open circuit in power line 3605. As shown in FIG. 36, power line 3605 is associated with a vertical column of thrusters that are associated with the area around points 3608. Because there is an open circuit 3607 in power line 3605, the thrusters associated with the area around points 3608 cannot be activated due to this fault condition.

Figure 37:
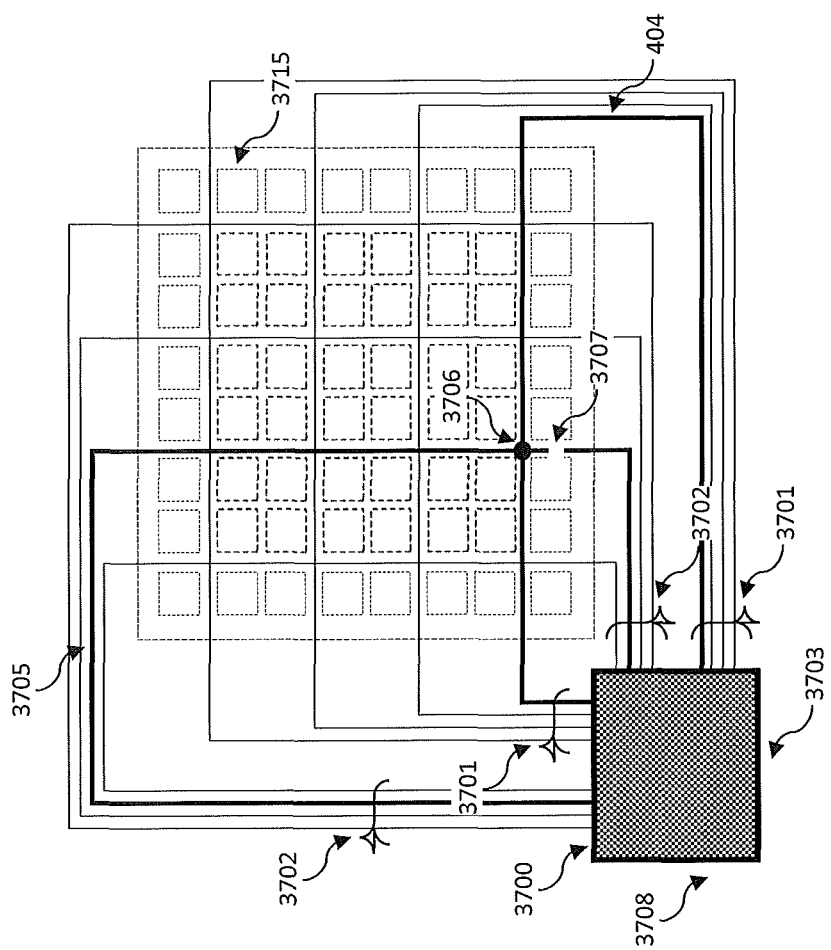
FIG. 37 is a top view of a preferred embodiment of a control system in accordance with the present disclosure that includes fault tolerance features.

In one embodiment of the control system, in order to achieve redundancy and avoid system failure when a fault condition occurs in a power line, redundant path connections are provided as illustrated in FIG. 37. Power lines 3701 are coupled to the horizontal rows of micro thrusters and that power lines 3702 are coupled to the vertical columns of micro thrusters. Thus, a redundant path is provided to point 3706 in the event that a fault occurs in line 3707 as shown in FIG. 37. Redundancy is provided by power lines 3705 and 3704 wherein the control unit 3700 reroutes electricity from power line 3707 to lines 3705 and 3704 to activate the micro thrusters near point 3706. In another embodiment of the present control system, a fault detection device 3708 is provided to detect a fault condition in any one of the power lines as shown in FIG. 37. The fault detection device 3708 is coupled to the power supply 3703 and control unit 3700 and which controls activation of an appropriate power line to compensate for or replace the power line in which the fault condition is present.

A capacitor bank voltage sensing technique may be used to detect a fault. By designing the capacitor bank to not discharge completely in a single pulse, and measuring the voltage charge before and after a power pulse has been sent to a thruster element, it is possible to determine the power consumed by the thruster and compare this to the expected power. If the drop is significantly smaller than expected, this is a sign of an open circuit; a significantly large drop indicates a short.

In-line current sensing may also be used to detect a fault. A shunt resistor may be placed in series with the power distribution lines in order to measure the instantaneous current being drawn by the array. If the current is usually low, some cells may be open. If the current is excessively high, there is a short. The primary disadvantage of this method is that it increases the series resistance between the power supply and the thrusters by a small (but nonzero) amount.

The significant advantage of this method over sensing the capacitor voltage after a pulse is that it is possible to design a system fast enough (most likely at a few MHz level sampling rate) to respond in real time to a short circuit and abort the pulse before enough energy has been released to cause serious damage to adjacent thrusters from arcing, or to the power supply from rapid discharge and consequently overheating. This system may also be applied to a micro thruster array operated in the continuous-duty mode.

Once a portion of the array has been declared faulty by any of the above methods, or another method as recognized by one of ordinary skill in the art, corrective action must be taken to minimize loss of thrust.

When performing timing analysis of a pulsed micro thruster array during the design phase, it is prudent to allow more than the minimum required cool-down time between successive pulses to any portion of the array. If this is done, the overall thrust may be maintained by removing the damaged portion or group of thrusters from the firing sequence and operating the remaining N-1 portions at a slightly increased duty cycle.

An increase in duty cycle can only compensate for a maximum amount of damage to an array. If this threshold is exceeded, a reduction in available thrust is unavoidable; an array's control system can be designed to compensate for loss of thrust on one side of a craft or other application using the micro thruster by slightly reducing the thrust on the corresponding opposite panel to maintain a level trim.

Figure 38:
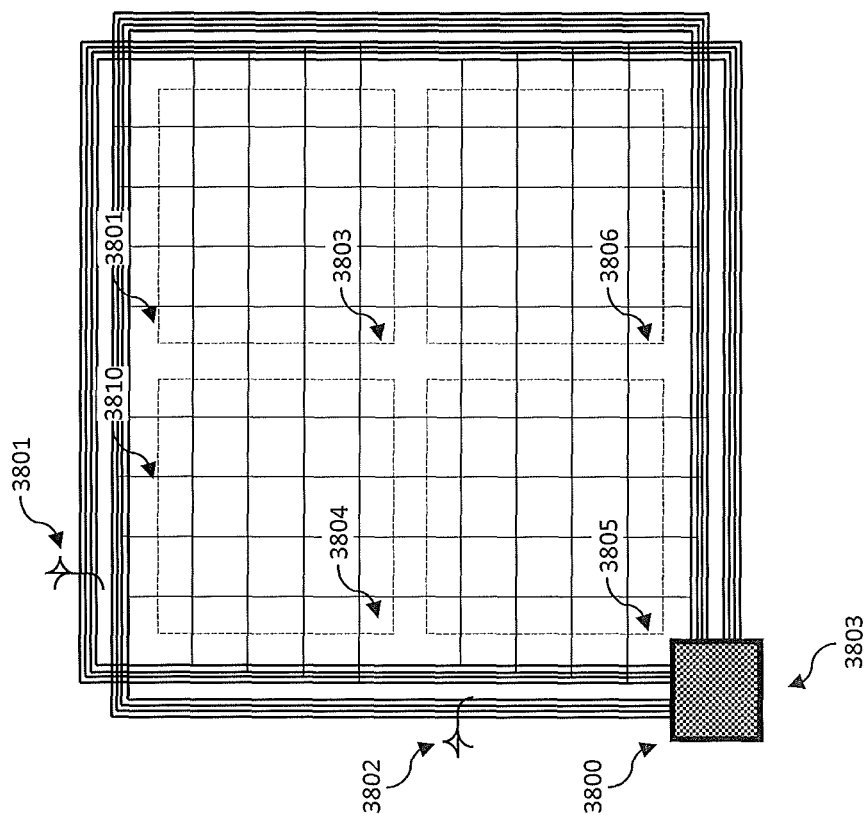
FIG. 38 is a top view of another preferred embodiment of the control system.

FIG. 38 is a top view of another embodiment of the present control system showing an array of power supply lines 3801 and 3802 and sub power line 3810 that are used to activate a group of micro thrusters 3803, 3804, 3805, and 3806 (shown in dotted line and which may be a plurality of individual micro thrusters). For example, the control unit 3800 may connect the power supply 3807 to an appropriate power line of power supply lines 3801 and an appropriate power line of power supply lines 3802 in order to cause electricity to flow in the sub power lines 3810 at and around micro thruster 3803. Additionally, the control unit 3800 can activate micro thruster 3803 and micro thruster 3805 or 3804 or 3806 simultaneously, sequentially, or in a desired pattern or for a desired effect by causing electricity to flow in the appropriate power lines of power supply lines 3801, 3802 and sub power lines 3810.

Figure 39:
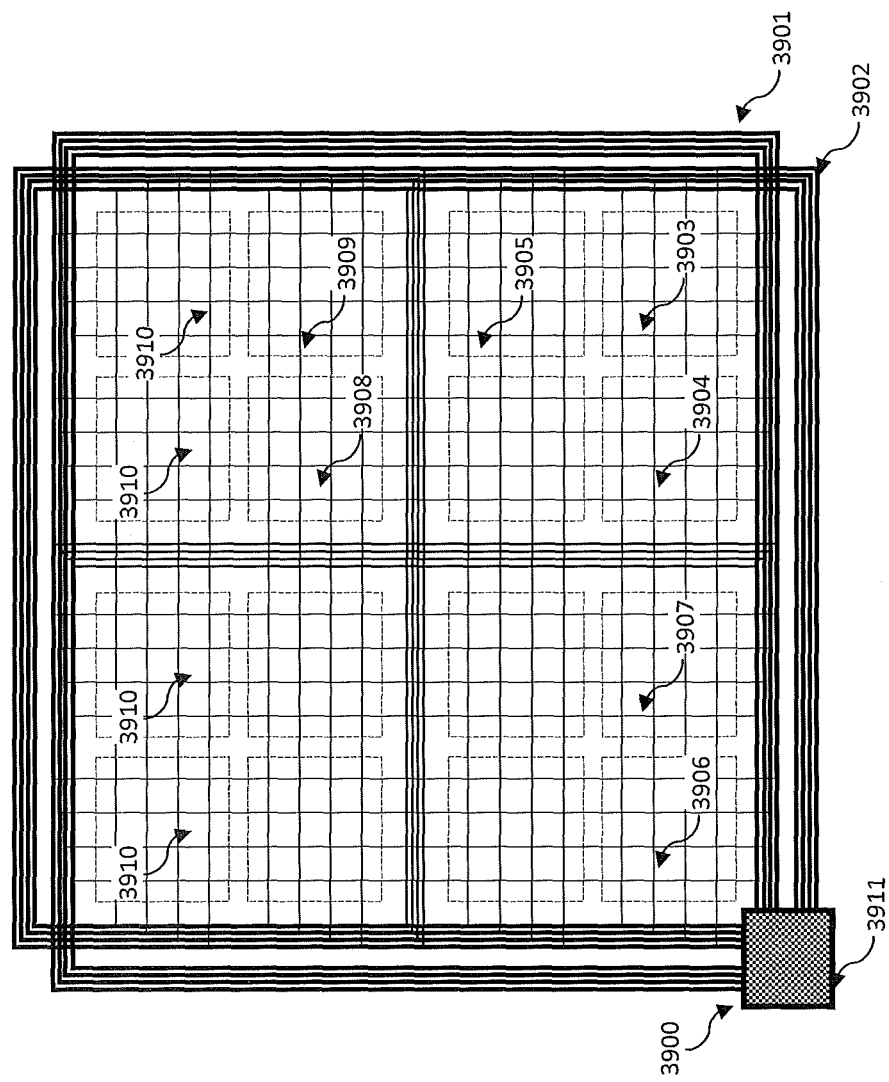
FIG. 39 is top view of another preferred embodiment of the control system.

FIG. 39 is a top view of a further embodiment similar to that shown in FIG. 38 of the present control system. FIG. 39 illustrates a plurality of power supply lines 3901 and 3902 and a plurality of sub power supply lines 3910 that form a grid structure as shown. The control unit 3900 may connect the power supply 3911 to an appropriate power line of power supply lines 3901 and an appropriate power line of power supply lines 3902 in order to cause electricity to flow in the sub power lines 3910 at and around micro thruster 3903. Furthermore, as discussed with FIG. 38, the control unit 3900 may activate any of micro thrusters 3903, 3904, 3905, 3906, 3907, 3908, and 3909 in a group or individually.

Figure 40A:
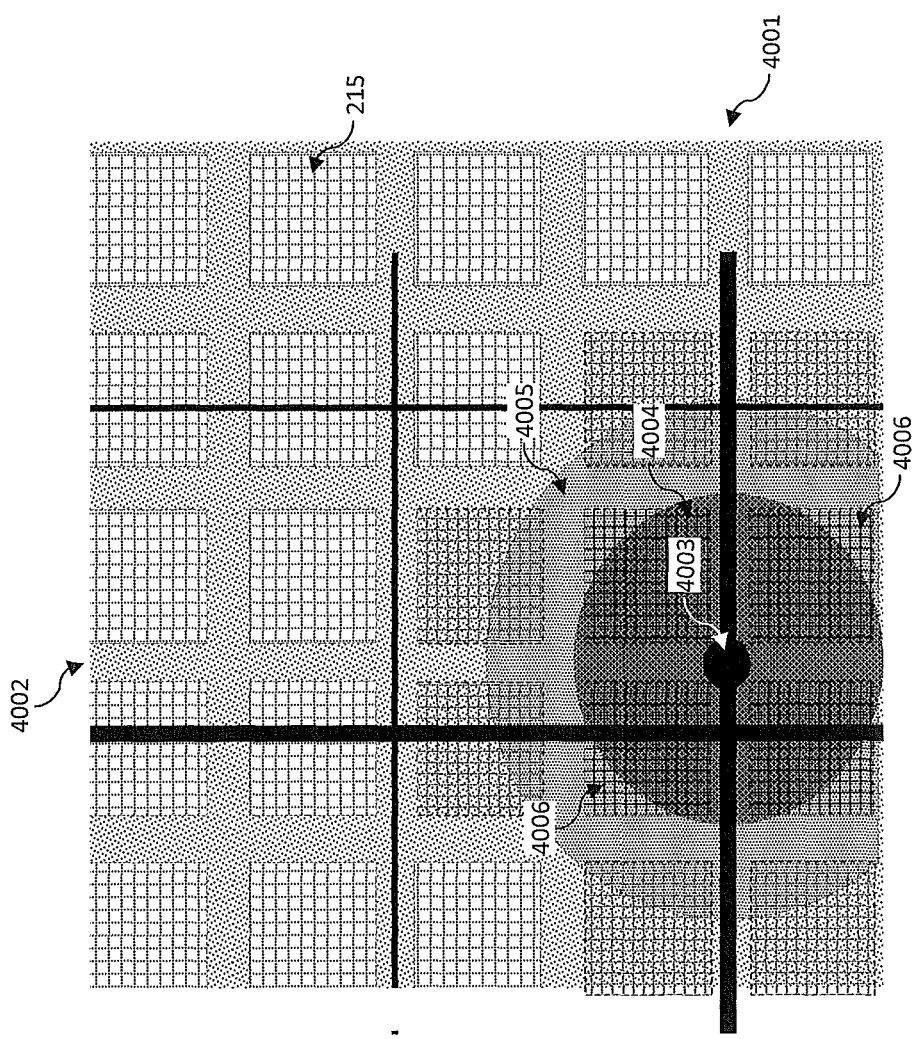
FIG. 40a is a top view of another embodiment of the present disclosure, showing an enlarged heating zone when a micro thruster is activated.
Figure 40B:
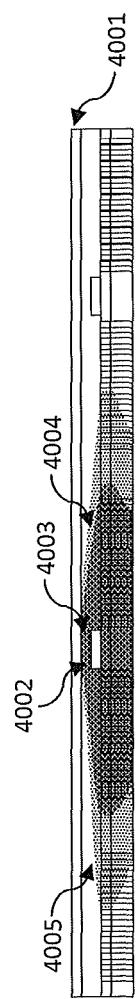
Figure 40C:
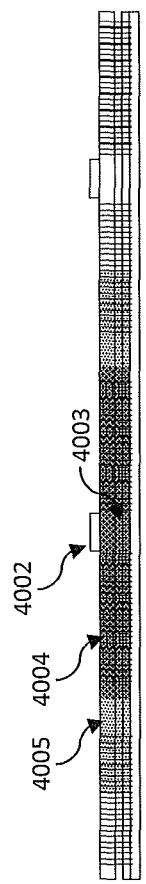

FIGS. 40a-40c shows an enlarged illustration of the embodiment of the control system shown in FIG. 34. Power lines 4001 and 4002 are used to activate the micro thrusters 4006 around point 4003. When the micro thrusters around point 4003 are activated due to the flow of electrical current through power lines 4001 and 4002, point 4003 heats up with area 4004 being the primary area affected and area 4005 being the secondary area affected.

Figure 41A:
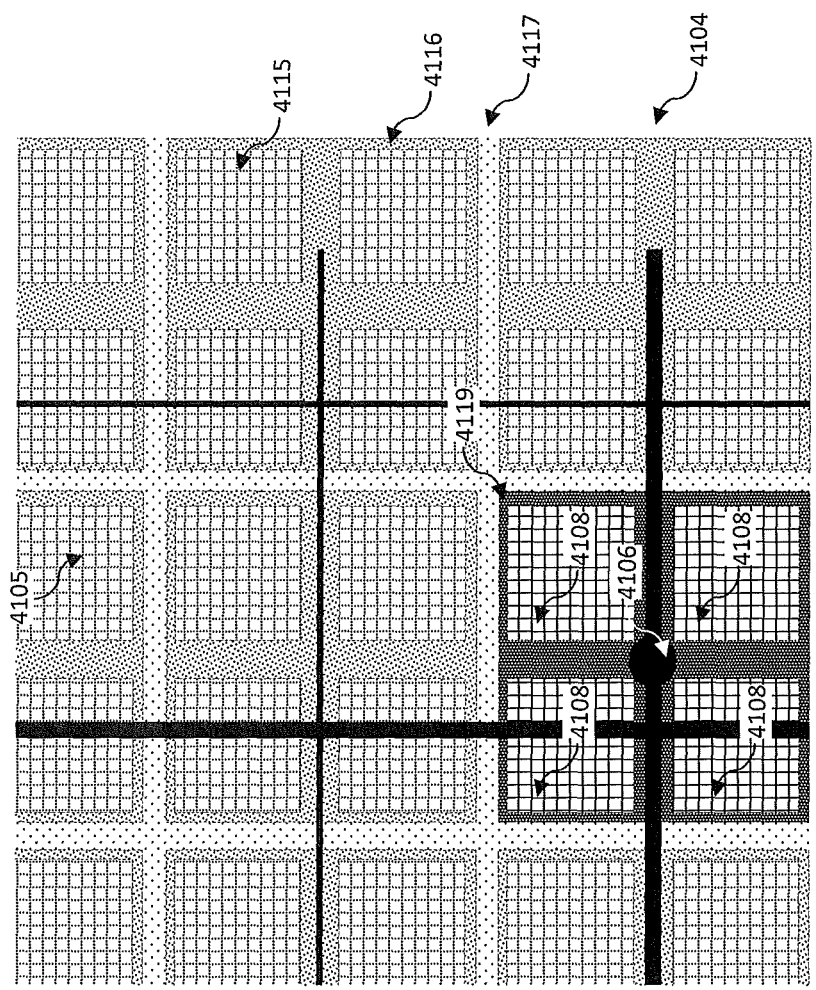
FIG. 41a is a top view of another embodiment of the present disclosure with a heat barrier.
Figure 41B:
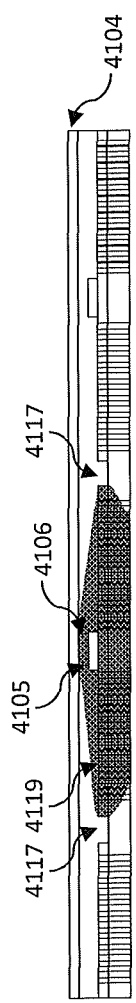

Because it may be undesirable for the heating of one point to cause heating of adjacent points, another exemplary embodiment is illustrated in FIGS. 41a and 41b, which shows the inclusion of a heat barrier 4117, which may be in the form of a conductive pad, an insulator, a gap, or any other form of heat barrier as recognized by one of ordinary skill in the art. The heat barrier 4117 has the effect of changing the heat conductivity and isolating the conductive areas. The heat barrier 4117 is shown as a perimeter around the micro thrusters 4108 that are adjacent a junction 4106 of power lines 4105 and 4104, however the heat barrier 4117 may be configured differently based on a different desired effect. By energizing power lines 4105 and 4104 the micro thrusters 4108 adjacent junction 4106 are activated and the heat barrier 4117 prevents other micro thrusters outside of the shaded box area shown as 4119 from being inadvertently activated.

Figure 42A:
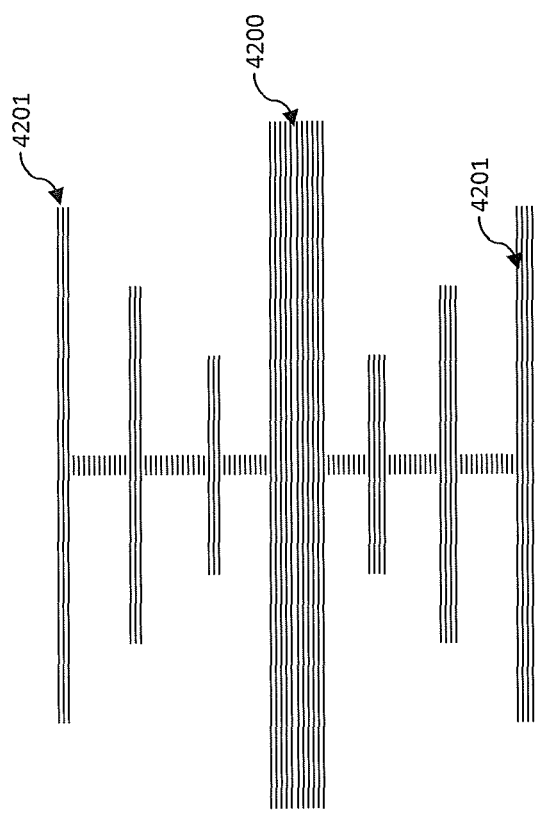
FIG. 42a is a top view of a grid structure for an array of micro thrusters which includes a plurality of power supply lines and branch lines to be used with the control system.
Figure 42B:
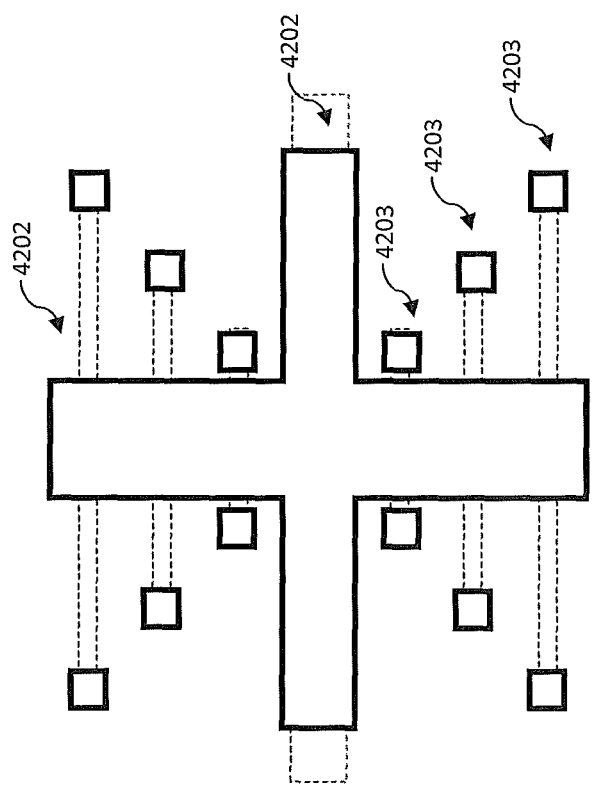
FIG. 42b a top of an optimized middle layer to be used with the control system.
Figure 42C:
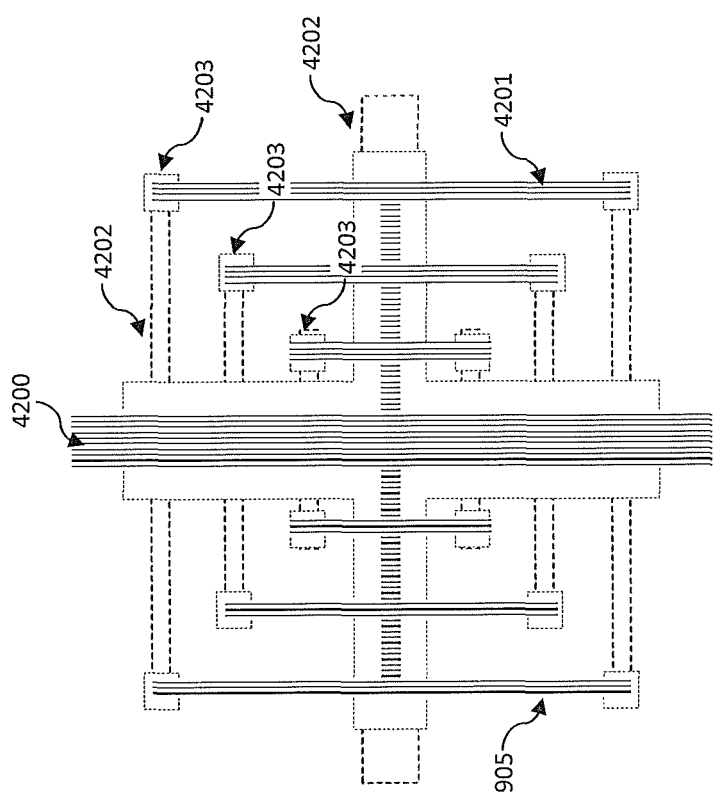
FIG. 42c is a top view of another preferred embodiment of the control system showing the combination of the grid structure shown in FIG. 42a and the optimized middle layer shown in FIG. 42b.

FIGS. 42a-42c shown the power lines or conductive structures of another embodiment of the control system. FIG. 42a shows a top layer grid structure 4202 of conductive lines to be used for activating an array of micro thrusters, where power supply lines 4200 are designed to be connected to a power supply and a plurality of branch lines 4201 are designed to be positioned in proximity to a plurality of micro thrusters.

FIG. 42b illustrates an optimized middle layer showing insulators 4202 and resistors 4203 to be used with the top layer grid structure shown in FIG. 42a.

FIG. 42c illustrates the combination of FIGS. 42a and 42b, where the top layer of FIG. 42a is placed over the middle layer of FIG. 42b. FIG. 42c shows power supply lines 4200 and branch lines 4201 overlaid onto the thermo-resistive heating junctions formed by resistors 4203 and insulators 4202 as in an embodiment of the control system.

Exemplary Resistive Temperature Gradient Formation

Figure 43:
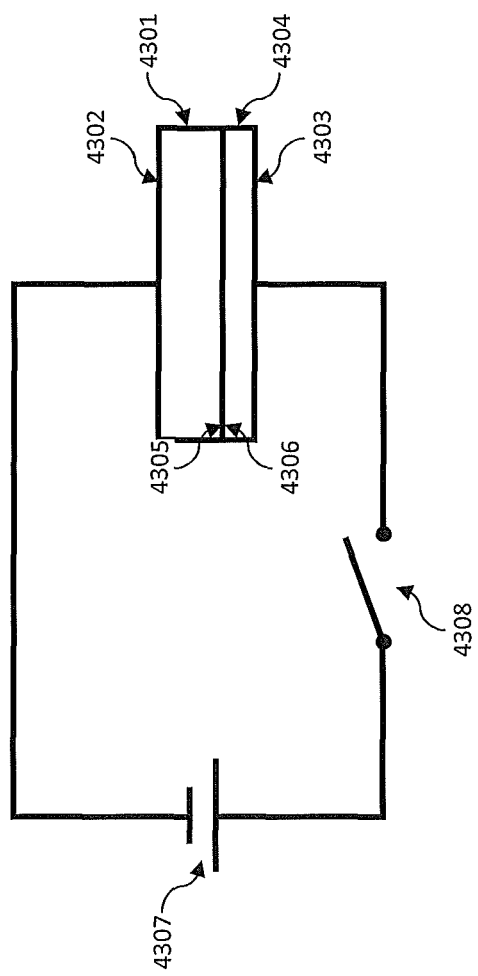
FIGS. 43 and 44 are schematic diagrams for creating a temperature gradient.

Reference is made to the section entitled "Means for Establishing a Temperature Differential", above, incorporated here by reference. FIG. 43 is schematic diagram of a device that can be used to create a temperature gradient in accordance with the present disclosure. In this section, the thermal gradient device may be, but is not limited to being, and NMSET device. The device includes a colder layer 4301 of an electrically conductive material having a top surface 4302 and a bottom surface 4305. A top surface 4306 of a hotter layer 4304 is closely proximate to and may be attached to bottom surface 4305 of colder layer 4301 directly or through a thermally and/or electrically insulating intermediate material depending on implementation.

One terminal of power supply 4307 is connected to top surface 4302 of the colder layer 4301 and the other terminal of power supply 4307 is connected to one side of switch 4308. The other side of switch 4308 is connected to bottom surface 4303 of the hotter layer 4304. The hotter layer 4304 is made of or is a structure with sub-layers that include a layer of a resistive material that heats up through resistive or Joule heating when electrical current passes through it. In embodiments with sub-layers, one might be an insulating material with reduced thickness near the locations a thermal gradient is to be produced, and a metallization layer that is configured to heat at a greater rate at the thermal gradient locations.

The colder layer 4301 might be of a material less subject to Joule heating in the operative locations. The difference in resistive, Joule heating characteristics can be accomplished through selection of materials, configuration (e.g., the hotter layer being thinner at the sites where heat is to be generated when compared to an opposing location of the colder layer so that the electron density in the hotter layer promotes Joule heating at a greater extent that the colder layer) or other factors that permit one layer to heat up to a greater extent or faster than an adjacent layer, or combinations thereof of these characteristics, depending on a particular embodiment. For instance, the hotter layer can be made up of surface wires that thin or become more narrow or otherwise have smaller in cross-section at sites where heating is desired, e.g., at a NMSet structure or groups of NMSet structures, such that the charge carrier density/resistance is greater at those sites, and Joule heating is more apparent. The colder layer can be a thicker, less resistive material having a broader area (e.g., cover the entire surface of the hotter layer) to reduce carrier density. Whatever the mechanism, the current in one layer promotes Joule heating, and in the other layer does not, at least not to the same extent of Joule heating in the one layer.

Further, the mechanism for passing current from one layer to the other can follow any suitable method or mechanism, such as quantum tunneling, semiconductor conduction were the colder and hotter layers are P-type and N-type semiconductors forming a PN junction, with electrode formed thereon on opposing surfaces, transistors connected to address line, similar to the read/write and address lines of memory devices, that permit an adjacent electrode to heat on one surface, with the switch being much like the structure of an addressable memory site or pixel, but with the memory site or pixel structure being replaced with a electrode that thermally heats, or nearly any other type of structure that will selectively address thermal gradient devices or clusters of such devices.

Alternatively or additionally, the hotter layer can have an input side and an output side in the same layer, wherein current passes through from one side to the other, resistively heating the hotter layer. This embodiment can produce heat at selected sites, and less so elsewhere, when the hotter surface is not entirely covered by an electrically conductive material, but rather has conductive lines, wherein the lines have characteristics that permit heating at selected sites, such as NMSet structures of groupings. That is, the lines can be large enough is cross-section to not heat, but at selected sites have a reduced cross-section to selectively heat upon application of current.

In the embodiment of FIG. 43, electrical current passes from the top layer 4301 to the bottom layer 4304. As shown in FIG. 43, switch 4308 is in an open condition. Thus, no current flows through layers 4301 and 4304. Accordingly, there is no temperature gradient or difference in temperature between surface 4302 and surface 4303.

Figure 44:
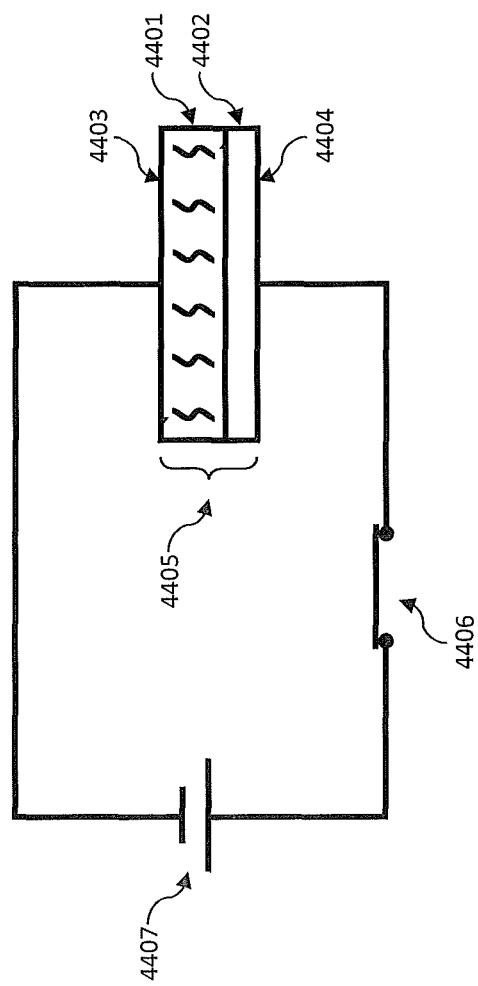

FIG. 44 showing the state where switch 4406 is closed. Thus, current from power supply 4407 flows through layers 4401 and 4402. As result of the current flow, layer 4402 begins to heat because of its resistive characteristics, thus causing layer 4401 to heat as well. The heating of layer 4402 causes a temperature gradient 4405 to be created between top layer 4403 and bottom layer 4404. When switch 4406 is opened, current no longer flows through layers 4401 and 4402. Thus, temperature gradient 4405 begins to diminish eventually to zero difference in temperature between surfaces 4403 and 4404.

Figure 45:
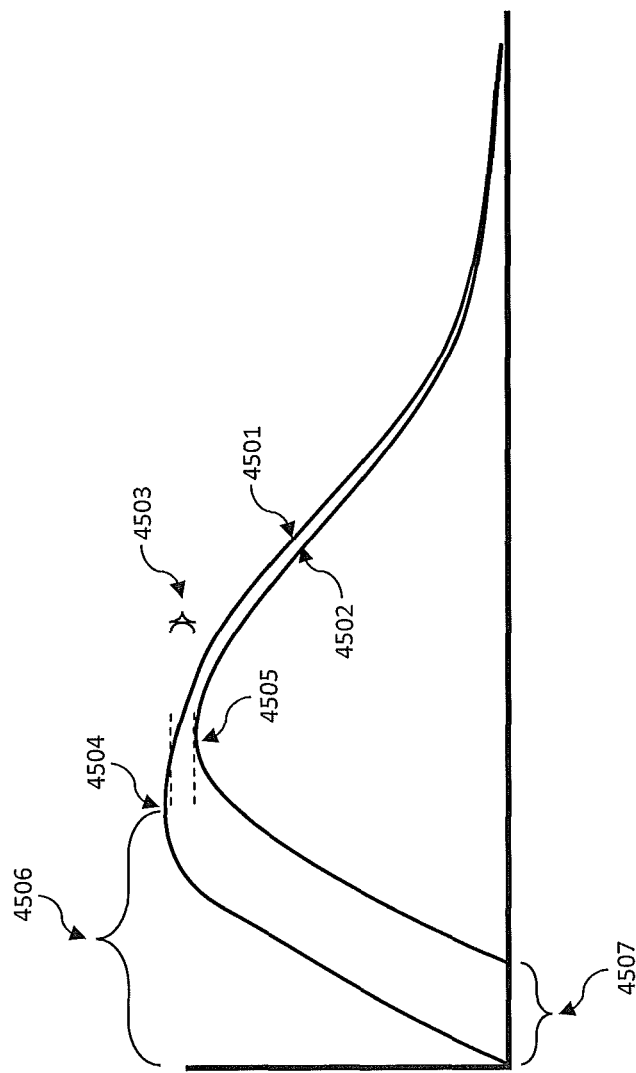
FIG. 45 is a plot showing the rise and fall in temperature in a device having a temperature gradient.

FIG. 45 plots of the temperature increase of surface 4404 as current begins to flow when switch 4406 is closed. Temperature is plotted along the y-axis and time is plotted along the x-axis. Note that the temperature of surface 4404 in FIG. 45 rapidly rises as indicated by plot 4501 to an equilibrium temperature 4504. When switch 4406 in FIG. 44 is opened and current no longer flows, the temperature will begin to drop.

The temperature of surface 4403 when switch 4406 is closed follows a similar but delayed pattern as the heat from layer 4402 begins to migrate toward surface 4403 through layer 4401 as indicated by plot 4502. The temperature of surface 4403 continues to rise to its equilibrium temperature 4505. When switch 4406 is opened and current no longer flows, the temperature will begin to drop. Reference number 4506 in FIG. 45 indicates the length of time that switch 4406 remained closed.

Thus, the temperature gradient between equilibrium temperature 4504 of surface 4404 and the equilibrium temperature 4505 of surface 4403 is represent in FIG. 45 as temperature gradient 4503.

As FIG. 45 illustrates, it takes a finite amount of time for the temperatures of surfaces 4403 and 4404 to return to their ambient state after current stops flowing through layers 4301 and 4304. The residual heat can cause problems if adjacent temperature gradient devices are in close proximity.

Figure 46:
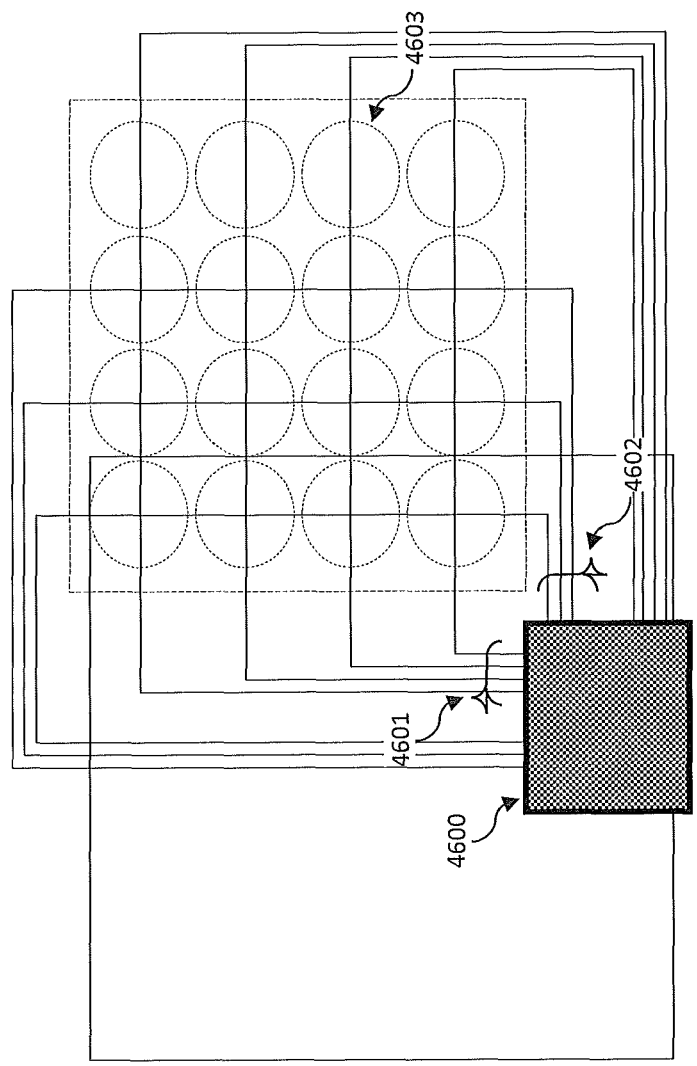
FIG. 46 is a top cross-sectional view of a plurality of temperature gradient devices arranged in horizontal and vertical rows in accordance with the present disclosure.
Figure 47:
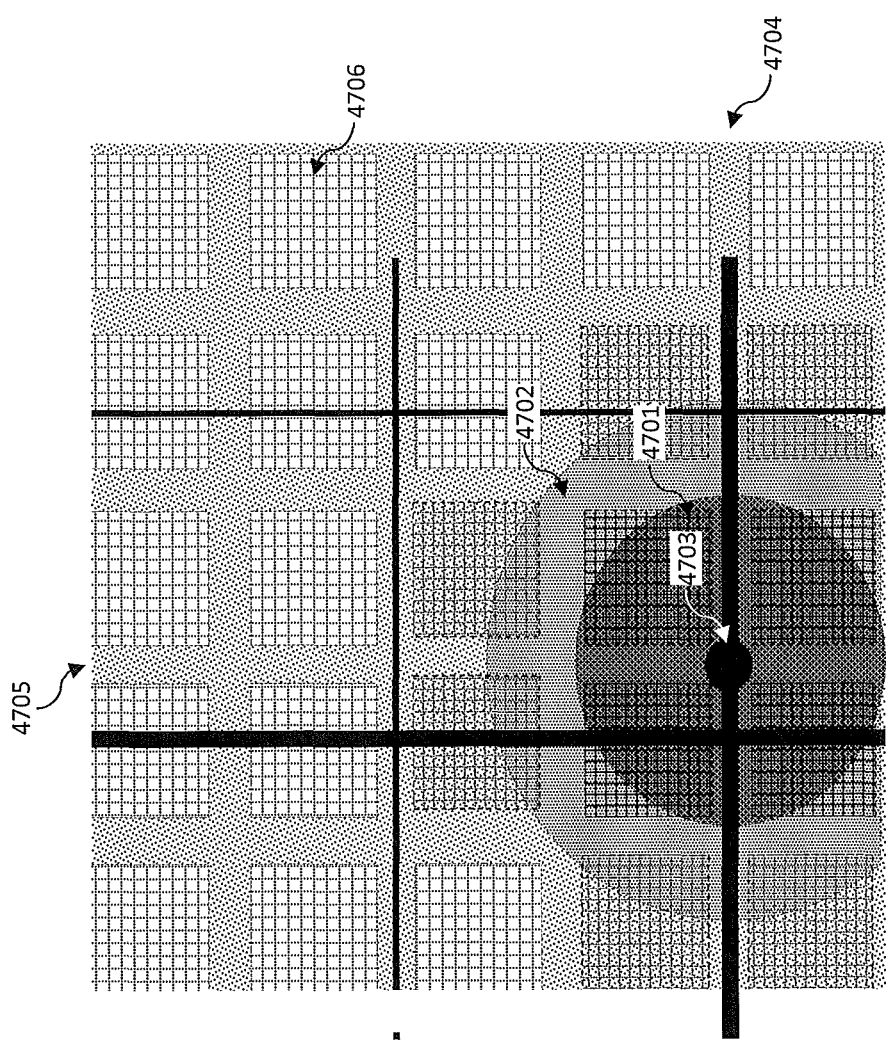
FIG. 47 is a top cross-sectional view of a plurality of temperature gradient devices showing the heating effect of adjacent devices when a temperature gradient device is activated.

FIG. 46 is a top cross-sectional view of a plurality of temperature gradient devices 4303 arranged in horizontal and vertical rows in accordance with another exemplary embodiment. Current flow is supplied to each device by a plurality of power lines 4601 and 4602 from a power and control unit 4300 in a matrix type manner. The control unit may be formed of a processor, particularly a programmable processor that can selectively actuate particular sites, as explained above with respect to control electronics at the active sites when the power lines operate like read/write and address lines to control adjacent control electronics a the active site, or simply by adding current to horizontal and vertical power lines such that at cross points enough current is present to create a temperature gradient. A source of electrical energy may be formed of a battery, or any other source of carriers, whether AC or DC, depending on implementation. Also, the section entitled "Fault Tolerance Control System", above, is incorporated herein With reference again to FIG. 46, if an adjacent temperature gradient device 4303 is activated before the first temperature gradient device 4303 is allowed to fully cool, the temperature gradient of the newly activated device may not be the expected gradient. Depending on the application, this may not be optimal. Such a condition is illustrated in FIG. 47 (and similarly in FIGS. 40a-40c, for instance) where a temperature gradient device 4703 is activated by power lines 4704 and 4705. As shown in FIG. 47, the generated heat radiates to a primary area 4701 and further to a secondary area 4702. Note that the radiated area encroaches upon other adjacent temperature gradient devices and could cause those devices not to produce the proper temperature gradient when they are activated. This potential problem can be mitigated or resolved by the selective activation of thermal gradient devices.

For example, the control unit 4600 shown in FIG. 46 avoids activation of those temperature gradient devices that are adjacent previously activated temperature gradient devices for a predetermined period of time, for example, for 1 ms. Doing so allows the previously activated temperature gradient device to fully cool, or at least cool to a satisfactory temperature, so that no residual heat interferes with the operation of adjacent temperature gradient devices. Further, the temperature gradient devices can be selectively addressed, either individually or in clusters, by read and address lines in a manner similar to the manner in which pixels on a digital display or memory sites in a memory array are addressed and controlled.

Figure 48:
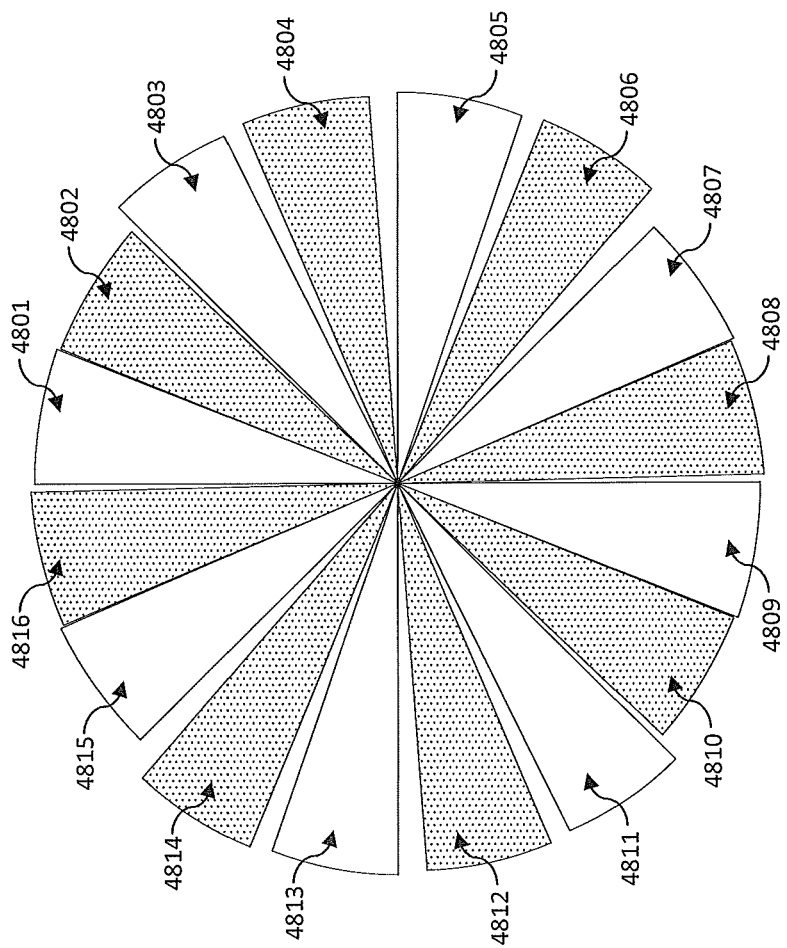
FIG. 48 illustrates an activation sequence for a temperature gradient device among a plurality of temperature gradient devices in accordance with the present disclosure.

FIG. 48 illustrates one embodiment of an activation sequence of temperature gradient devices in an array of temperature gradient devices in accordance with this embodiment. Reference number 4801 represents a temperature gradient device in an array of such devices as illustrated in FIG. 46. Reference number 4802 represents an adjacent temperature gradient device, or an adjacent array of such devices. The pattern repeats as indicated by reference numbers 4803-4816 for a total of 16 temperature gradient devices, or arrays of such devices as illustrated, though of course in most embodiments involving NMSet devices there would be more.

Using FIG. 48, one of ordinary skill in the art will readily understand that an activation sequence for individual or sets of temperature gradient devices can be determined which avoids or mitigates thermal interference from a previously activated adjacent device. This is so because enough time has elapsed for the previously activated adjacent device to sufficiently cool. For example, temperature gradient device pairs (4801, 4809), (4803, 4811), (4805, 4813) and (4807, 4815) may be activated followed by pairs (4802, 4810), (4804, 4812), (4806, 4814) and (4808, 4816) without significant causing thermal interference to any previously activated adjacent devices. Other activation sequences will become known to those skilled in the art from a review of FIG. 48.

As can be seen, the disclosed embodiments can have many applications for creating thermal gradients. In particular, though not limited thereto, the thermal gradient structures can be in the form of micro-thrusters, and even more particularly NMSet micro-thrusters of many forms and variations disclosed elsewhere herein.

As described herein, for example, the invention may be embodied in software (e.g., a plug-in or standalone software), in a machine (e.g., a computer system, a microprocessor-based appliance, etc.) that includes software in memory, or in a non-transitory computer-readable storage medium configured to carry out the control schemes (e.g., in a self contained silicon device, a solid state memory, an optical disc, or a magnetic disc, among others).

While the foregoing specification teaches the principles of the present invention, with examples provided for the purpose of illustration only, it will be appreciated by one skilled in the art from reading this disclosure that various changes and modifications in form and detail can be made, and equivalents employed, without departing from scope of the appended claims, which are to be given their full breadth.

What is claimed is:

1. A method of controlling creation of a temperature gradient among a plurality of temperature gradients, said method comprising steps of:
    creating a plurality of temperature gradients in a plurality of interrelated temperature gradient structures, each of said temperature gradient structures comprising:
        a first layer of conductive material having a first surface, an opposing second surface and having electrical resistive properties;
        a second layer of material having a first surface and an opposing second surface, wherein said first surface of said second layer being adjacent said second surface of said first layer;
        a power supply with first and second electrical terminals, said first electrical terminal being electrically coupled to said first surface of said first layer; and
        a switch device having at least one input terminal and at least one output terminal, said input terminal being coupled to said second electrical terminal of said power supply and said output terminal of said switch device being electrically coupled to said temperature gradient structure at a location that permits resistive heating of said first layer, wherein when said switch is closed, an electrical current flows through said first layer to heat said first layer via resistive heating and create a temperature gradient between said second surface of said heated first layer and said first surface of said second layer; and
    controlling the operation of said plurality of switch devices by a control unit, wherein said control unit controls said switch devices to create a selected temperature gradient.

2. The method of claim 1, wherein controlling the operation of the switch devices mitigates against creation of temperature gradients adjacent said selected temperature gradient structure for a predetermined time.

3. The method of claim 2, wherein said predetermined time is 1 ms.

4. The method of claim 1, further including a step of providing a processor for said control unit.

5. The method of claim 1, further including a step of forming said temperature gradients using micro-thrusters.

6. The method of claim 1, further including a step of forming said temperature gradients using NanoMolecular Solid State Electrodynamic Thruster ("NMSet") elements.

7. The method of claim 6, further including a step of forming said plurality of temperature gradients in a plurality of vertical rows.

8. The method of claim 6, wherein said plurality of temperature gradients is located in a plurality of locations where vertical rows and horizontal rows intersect.

9. The method of claim 1, further including a step of forming said plurality of temperature gradients in a plurality of horizontal rows.

10. The method of claim 1, further including a step of controlling by said control unit the operation of said plurality of switch devices to create a selected plurality of temperature gradients and mitigate against creation of temperature gradients adjacent said selected plurality of temperature gradient structures for a predetermined time.

11. The method of claim 10, wherein said predetermined time is 1 ms.

12. The method of claim 10, further including a step of forming said temperature gradients using NanoMolecular Solid State Electrodynamic Thruster ("NMSet") elements.

13. A device controlling creation of a temperature gradient among a plurality of temperature gradients, said device comprising:
    a plurality of temperature gradient structures, each of said temperature gradient structures comprising:
        a first layer of conductive material having a first surface, an opposing second surface and having electrical resistive properties;

a second layer of material having a first surface and an opposing second surface, wherein said first surface of said second layer being adjacent said second surface of said first layer;

a power supply with first and second electrical terminals, said first electrical terminal being electrically coupled to said first surface of said first layer; and a switch device having at least one input terminal and at least one output terminal, said input terminal being coupled to said second electrical terminal of said power supply and said output terminal of said switch device being electrically coupled to said temperature gradient structure at a location that permits resistive heating of said first layer, wherein when said switch is closed, an electrical current flows through said first layer to heat said first layer via resistive heating and create a temperature gradient between said second surface of said heated first layer and said first surface of said second layer; and a control unit controlling the operation of said plurality of switch devices, wherein said control unit controls said switch devices to create a selected temperature gradient.

14. The device of claim 13, wherein said control unit controls the operation of the switch devices mitigates against creation of temperature gradients adjacent said selected temperature gradient structure for a predetermined time.

15. The device of claim 13, wherein said control unit includes a processor.

16. The device of claim 13, wherein said temperature gradient structures include micro-thrusters.

17. The device of claim 13, wherein said temperature gradient structures include NanoMolecular Solid State Electrodynamic Thruster ("NMSet") elements.

18. The device of claim 13, wherein said temperature gradient structures are arranged in a plurality of rows.

19. The device of claim 13, wherein said temperature gradient structures are at intersections of orthogonal rows.

* * * * *